(12) United States Patent
Sharma et al.

(10) Patent No.: US 11,138,499 B2
(45) Date of Patent: Oct. 5, 2021

(54) APPLICATIONS OF BACK-END-OF-LINE (BEOL) CAPACITORS IN COMPUTE-IN-MEMORY (CIM) CIRCUITS

(71) Applicant: Intel Corporation, Santa Clara, CA (US)

(72) Inventors: Abhishek Sharma, Hillsboro, OR (US); Jack T. Kavalieros, Portland, OR (US); Ian A. Young, Portland, OR (US); Sasikanth Manipatruni, Portland, OR (US); Ram Krishnamurthy, Portland, OR (US); Uygar Avci, Portland, OR (US); Gregory K. Chen, Portland, OR (US); Amrita Mathuriya, Portland, OR (US); Raghavan Kumar, Hillsboro, OR (US); Phil Knag, Hillsboro, OR (US); Huseyin Ekin Sumbul, Portland, OR (US); Nazila Haratipour, Hillsboro, OR (US); Van H. Le, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 448 days.

(21) Appl. No.: 16/147,176

(22) Filed: Sep. 28, 2018

(65) Prior Publication Data
US 2019/0138893 A1 May 9, 2019

(51) Int. Cl.
*G06N 3/063* (2006.01)
*H01L 27/108* (2006.01)
(Continued)

(52) U.S. Cl.
CPC .......... *G06N 3/0635* (2013.01); *G06F 17/16* (2013.01); *G06N 3/04* (2013.01); *G11C 7/1006* (2013.01);
(Continued)

(58) Field of Classification Search
CPC .............. G11C 11/54; H01L 28/00–92; H01L 27/222–228; H01L 27/11502–11514; G06N 3/02–105
See application file for complete search history.

(56) References Cited

U.S. PATENT DOCUMENTS

| | | |
|---|---|---|
| 2017/0117041 A1 | 4/2017 | Hamdioui et al. |
| 2017/0162105 A1 | 6/2017 | Kim |

(Continued)

OTHER PUBLICATIONS

Ambrogio, S., et al., "Equivalent-Accuracy Accelerated Neural-Network Training Using Analogue Memory," Nature, vol. 558, Jun. 7, 2018, 22 pages.

(Continued)

*Primary Examiner* — Amar Movva
(74) *Attorney, Agent, or Firm* — Compass IP Law PC

(57) ABSTRACT

An apparatus is described. The apparatus includes a compute-in-memory (CIM) circuit for implementing a neural network disposed on a semiconductor chip. The CIM circuit includes a mathematical computation circuit coupled to a memory array. The memory array includes an embedded dynamic random access memory (eDRAM) memory array. Another apparatus is described. The apparatus includes a compute-in-memory (CIM) circuit for implementing a neural network disposed on a semiconductor chip. The CIM circuit includes a mathematical computation circuit coupled to a memory array. The mathematical computation circuit includes a switched capacitor circuit. The switched capacitor circuit includes a back-end-of-line (BEOL) capacitor coupled to a thin film transistor within the metal/dielectric layers of the semiconductor chip. Another apparatus is described. The apparatus includes a compute-in-memory (CIM) circuit for implementing a neural network disposed on a semiconductor chip. The CIM circuit includes a mathematical computation circuit coupled to a memory array.

(Continued)

The mathematical computation circuit includes an accumulation circuit. The accumulation circuit includes a ferroelectric BEOL capacitor to store a value to be accumulated with other values stored by other ferroelectric BEOL capacitors.

19 Claims, 48 Drawing Sheets

(51) Int. Cl.

| | | |
|---|---|---|
| H01L 27/11502 | (2017.01) | |
| G06N 3/04 | (2006.01) | |
| G06F 17/16 | (2006.01) | |
| H01L 27/11 | (2006.01) | |
| G11C 11/54 | (2006.01) | |
| G11C 7/10 | (2006.01) | |
| G11C 11/419 | (2006.01) | |
| G11C 11/409 | (2006.01) | |
| G11C 11/22 | (2006.01) | |

(52) U.S. Cl.
CPC ............ *G11C 7/1039* (2013.01); *G11C 11/54* (2013.01); *H01L 27/10802* (2013.01); *H01L 27/10844* (2013.01); *H01L 27/10852* (2013.01); *H01L 27/10897* (2013.01); *H01L 27/1116* (2013.01); *H01L 27/11502* (2013.01); *G11C 11/221* (2013.01); *G11C 11/409* (2013.01); *G11C 11/419* (2013.01)

(56) References Cited

U.S. PATENT DOCUMENTS

| | | |
|---|---|---|
| 2018/0075339 A1 | 3/2018 | Ma et al. |
| 2018/0157970 A1 | 6/2018 | Henry et al. |

OTHER PUBLICATIONS

Biswas, A., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 488-490.

Fick, D., et al., "Analog Computation in Flash Memory for Datacenter-Scale AI Inference in a Small Chip", 2.05 Mythic Hot Chips, 2018, 28 pages.

Gonugondla, S.K., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 490-492.

Henzler, S., "Chapter 2, Time-to-Digital Converter Basics", Springer Series in Advanced Microelectronics 29, 2, Springer Science+Business Media B.V. 2010.

Mason, A., "Memory Basics", Michigan State, ECE 410, Chapter 13 Lecture Notes, pp. 13.1-13.34, 2010.

Solanki, Umang, "How does SRAM work?", https://www.quora.com/How-does-SRAM-work, Aug. 17, 2017, 2 pages.

Stone, Harold S. "A Logic-In-Memory Computer", IEEE Transactions on Computers, Jan. 1970, 6, pages.

Zhang, J., et al., "In-Memory Computation of a Machine-Learning Classifier in a Standard 6T SRAM Array," in IEEE Journal of Solid-State Circuits, vol. 52, No. 4, 10 pages, Apr. 2017.

International Search Report and Written Opinion for PCT Patent Application No. PCT/US2019/47774, dated Dec. 18, 2019, 9 pages.

Chang, Mu-Tien, et al., "Technology Comparison for Large Last-Level Caches (L3Cs): Low-Leakage SRAM, Low Write-Energy STT-RAM, and Refresh-Optimized eDRAM", HPCA 2013.

Kang, Mingu, et al., "An In-Memory VLSI Architecture for Convolutional Neural Networks", http://ieee-cas.org/pubs/ietcas, Published Version DOI: 10.1109/JETCAS.2018.2829522, Publication Apr. 23, 2018, IEEE Circuits and Systems Society, 13 pages.

Kim, Han Joon, "Gain Size Engineering for Ferroelectric Hf0.5Zr0.5O2 Films by an Insertion of Al2O3 Interlayer", Applied Physics Letters 105, 192903 (2014), 6 pages.

Lun, Sang "Ferroelectricity in Nanocrystalline Hf0.5Zr0.5O2 Thin Films", Lund University Master Thesis, Nanoelectronics Group, Department of Electrical and Information Technology, LTH, Feb. 26, 2018, 52 pages.

Materlik, R., et al., "The Origin of Ferroelectricity in Hfxzr1-xO: A computational Investigation and a Surface Energy Model", Journal of Applied Physics 117, 134109 (2015), 50 pages.

Meinerzahagen, P., Gain-Cell Embedded DRAMs for Low-Power VLSI, Chapter 2, Gain-Cell eDRAMs (GC-eDRAMs): Review of Basics and Prior Art.

Park, Min Hyuk, et al., "Evolution of Phase and Ferroelectric Properties of Thin Hf0.5 Zr0.5O2 Films According to the Thickness and Annealing Temperature", Applied Physics Letters 102, 242905 (2013), 5 pages.

Pesic, Milan, et al., "A Computational Study of Hafnia Based Ferroelectric Memories: From Ab-initio via Physical Modeling to Circuit Models of Ferroelectric Device", Journal of computational Electronics, Aug. 2017, 24 pages.

Schroeder, Uwe, et al., "Ferroelectricity in Doped Hafnium Oxide", ISA, State College, Conference Paper, May 15, 2014, 41 pages.

Sunimura, H., et al., "Overview and Future Challenges eDRAM Technologies", Extended Abstracts of the 2006 International Conference on Solid State Devices and Materials, Yokohama, 2006 2 pages.

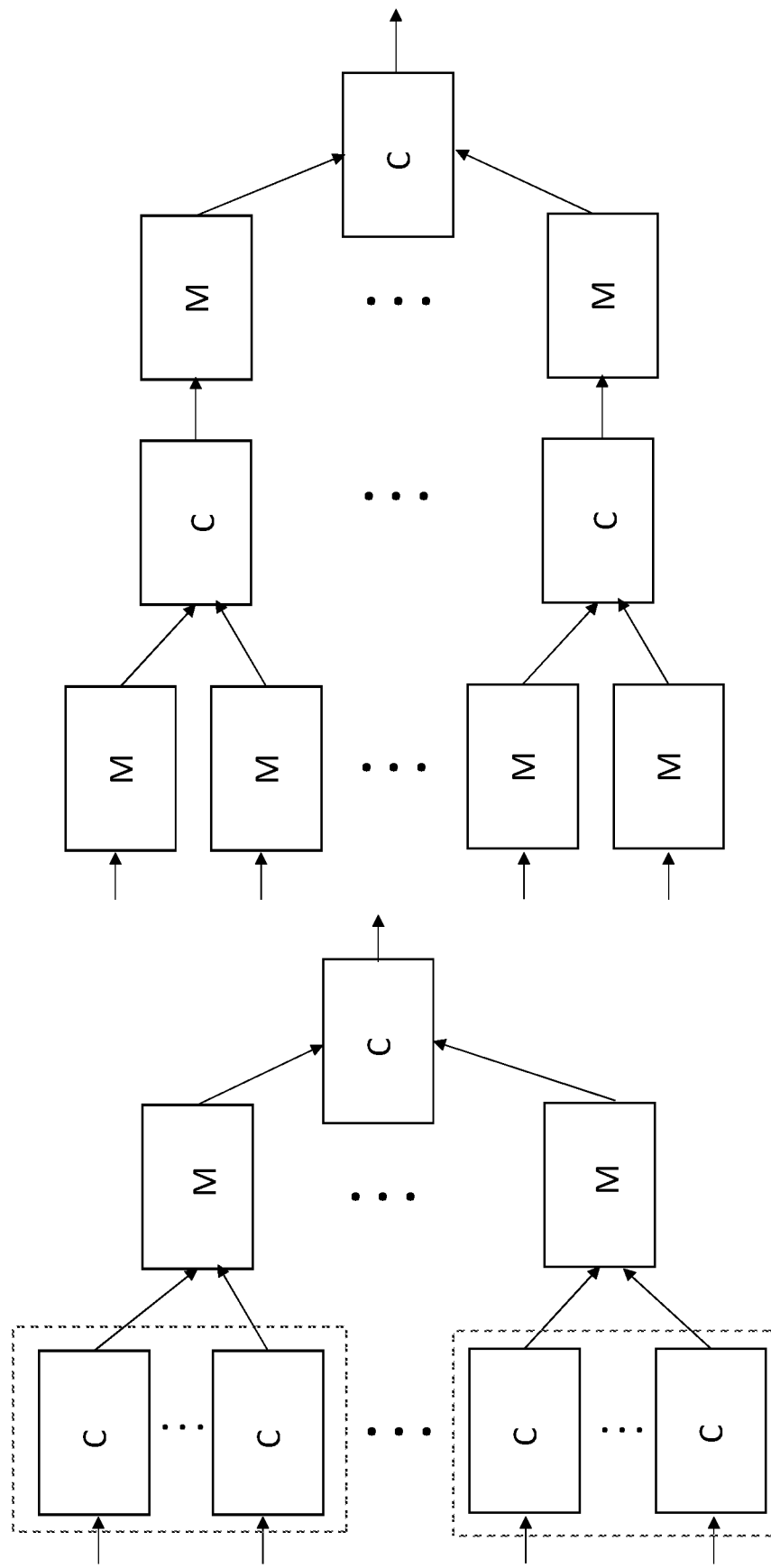

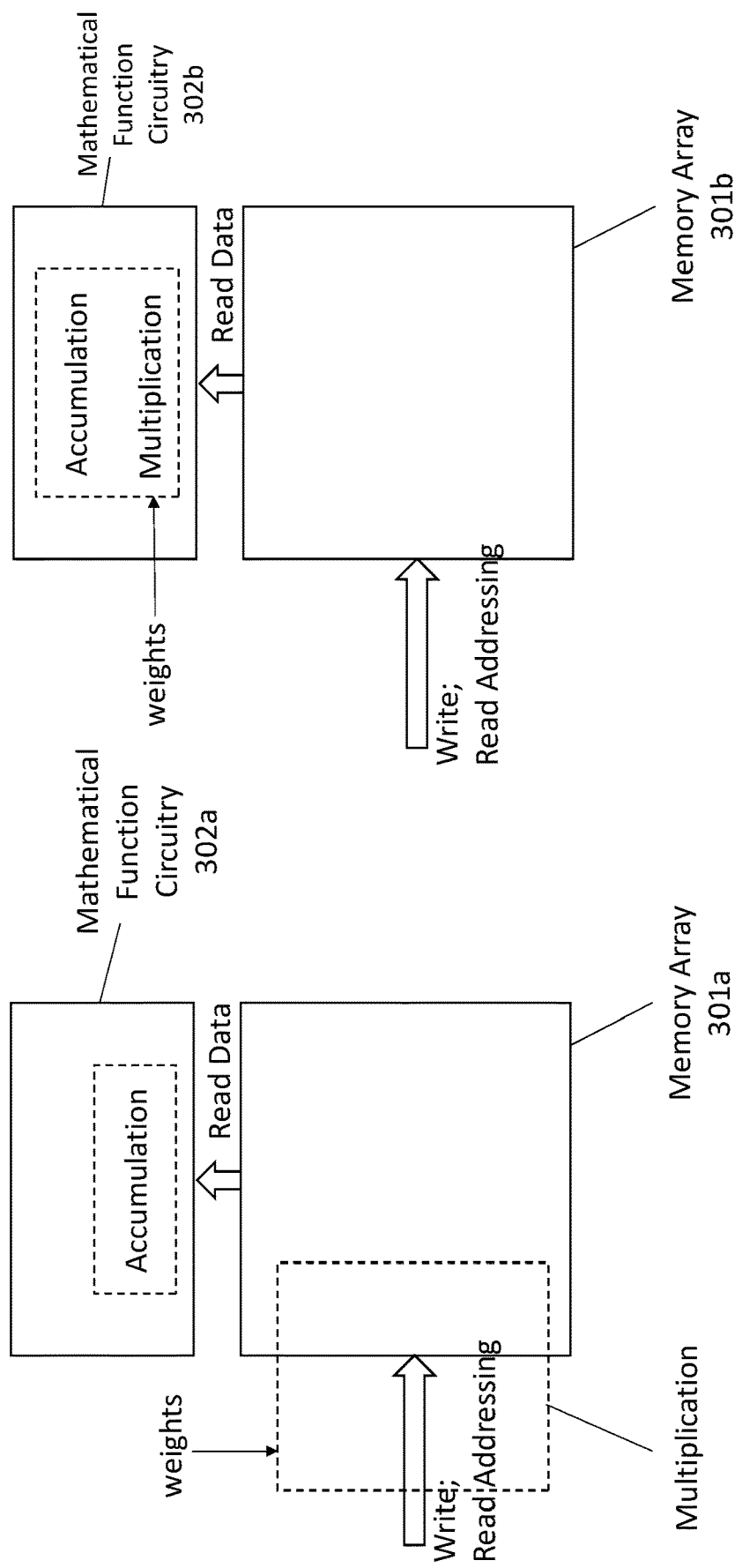

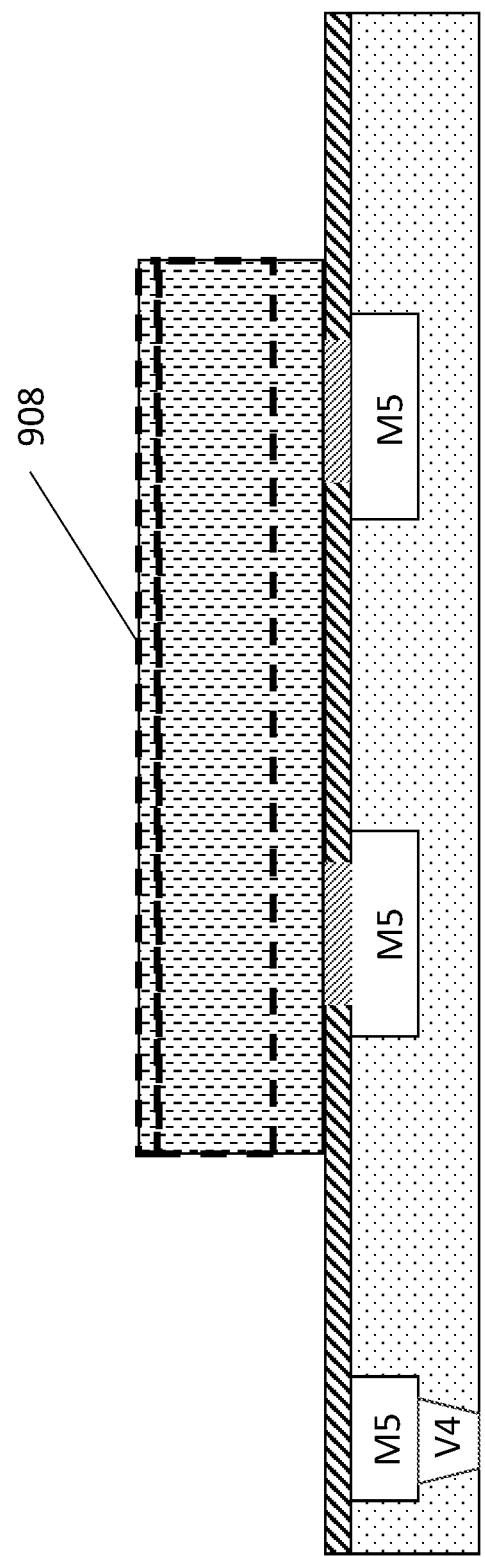

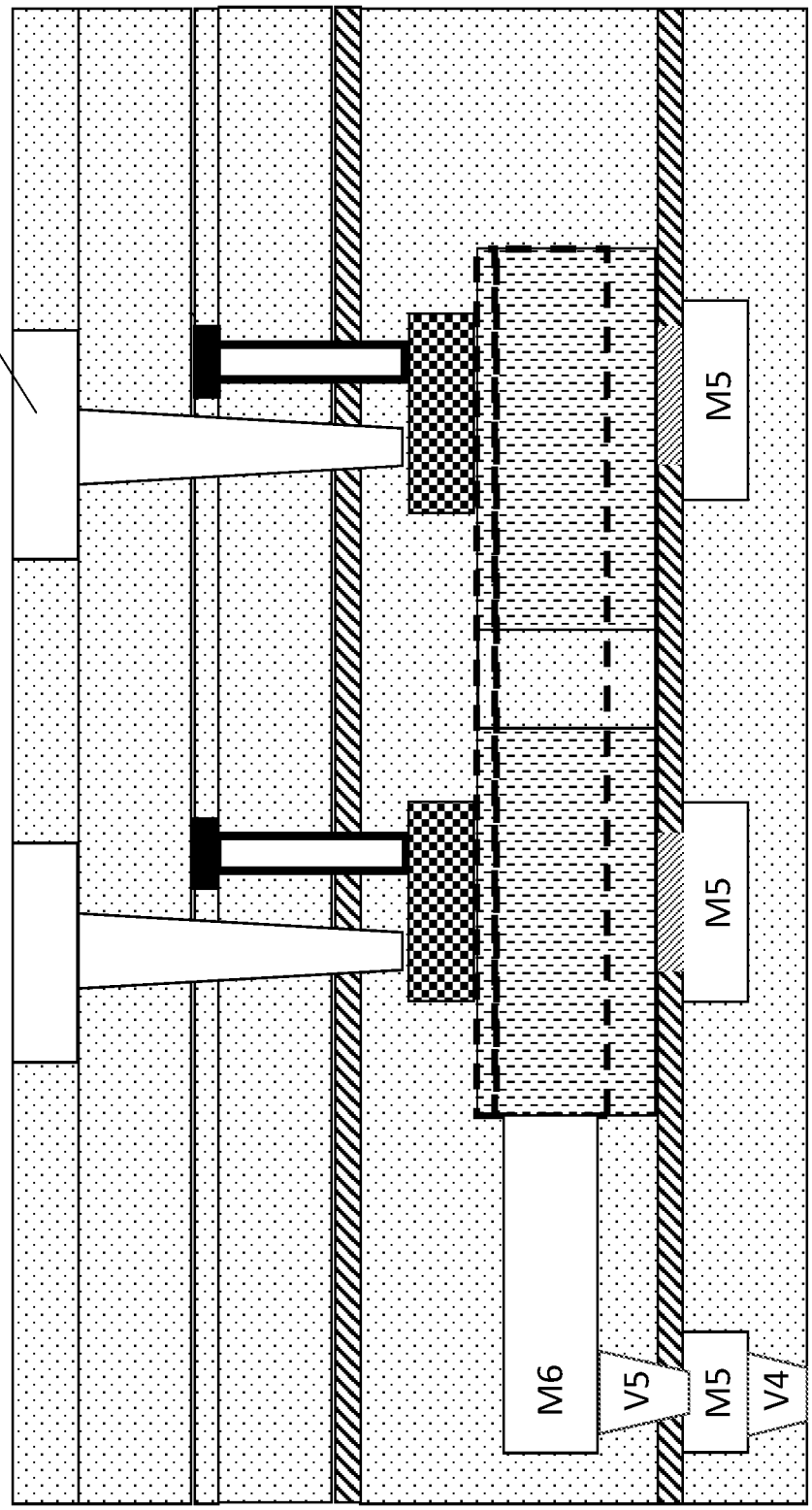

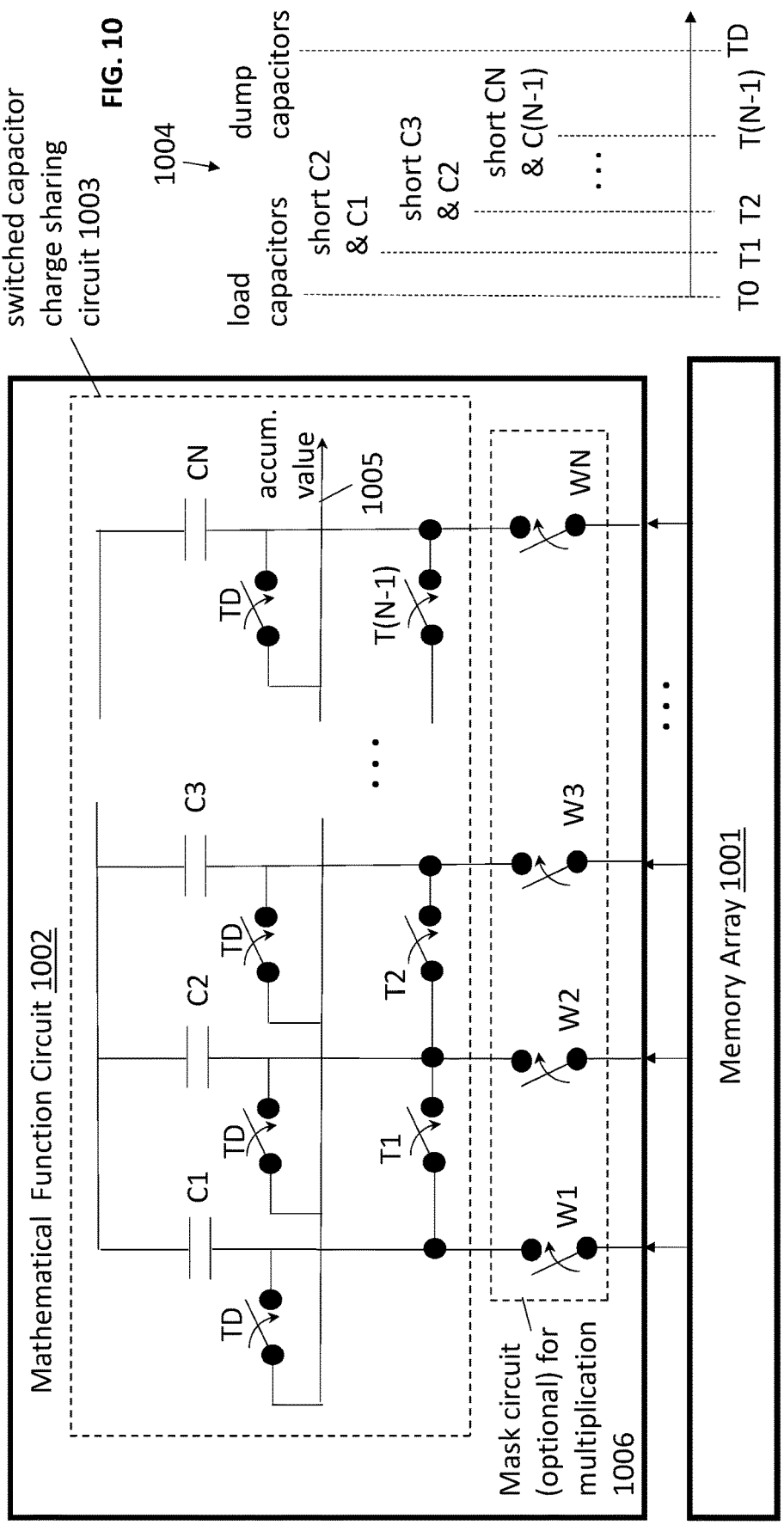

APPLICATIONS OF BACK-END-OF-LINE (BEOL) CAPACITORS IN COMPUTE-IN-MEMORY (CIM) CIRCUITS

FIELD OF INVENTION

The field of invention pertains generally to the computer sciences, and, more specifically, to applications of back-end-of-line (BEOL) capacitors in compute-in-memory (CIM) circuits.

BACKGROUND

With the continually increasing device densities achieved by modern day semiconductor manufacturing processes, artificial intelligence has emerged as the next significant reachable application for semiconductor based information processing. Attempting to realize semiconductor based artificial intelligence, however, creates motivations for new kinds of semiconductor processor chip designs and manufactured structures.

FIGURES

A better understanding of the present invention can be obtained from the following detailed description in conjunction with the following drawings, in which:

FIGS. 2a through 2g show examples of different possible compute-in-memory unit cells;

FIGS. 3a and 3b show different CIM circuit architectures;

FIGS. 9a, 9b, 9c, 9d, 9e, 9f, 9g, 9h, 9i, 9j, 9k, 9l, 9m, 9n, 9o, 9p, 9q, 9r, 9s show a process for manufacturing the structures of FIGS. 8a and 8b;

FIG. 10 shows a switched capacitor circuit accumulation circuit;

Figure 13:
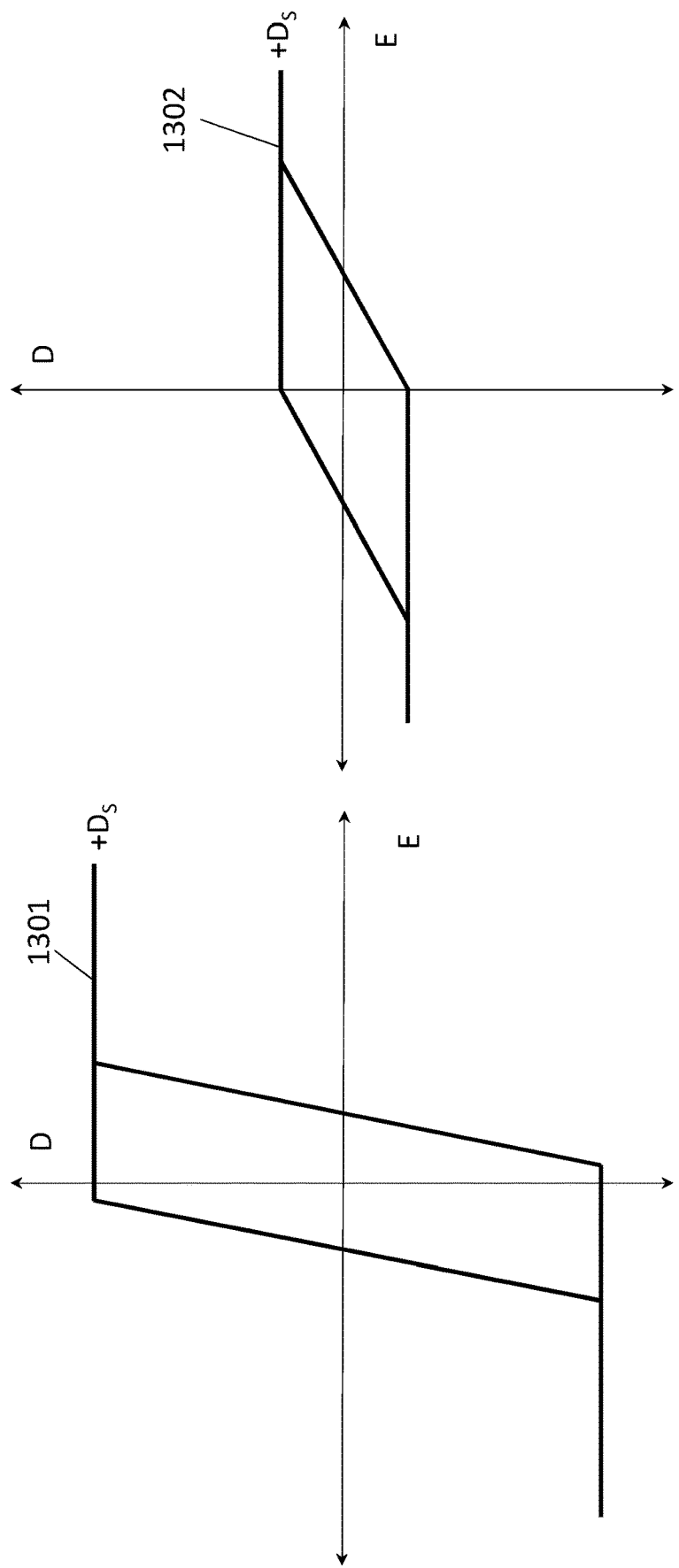
Figure 14:
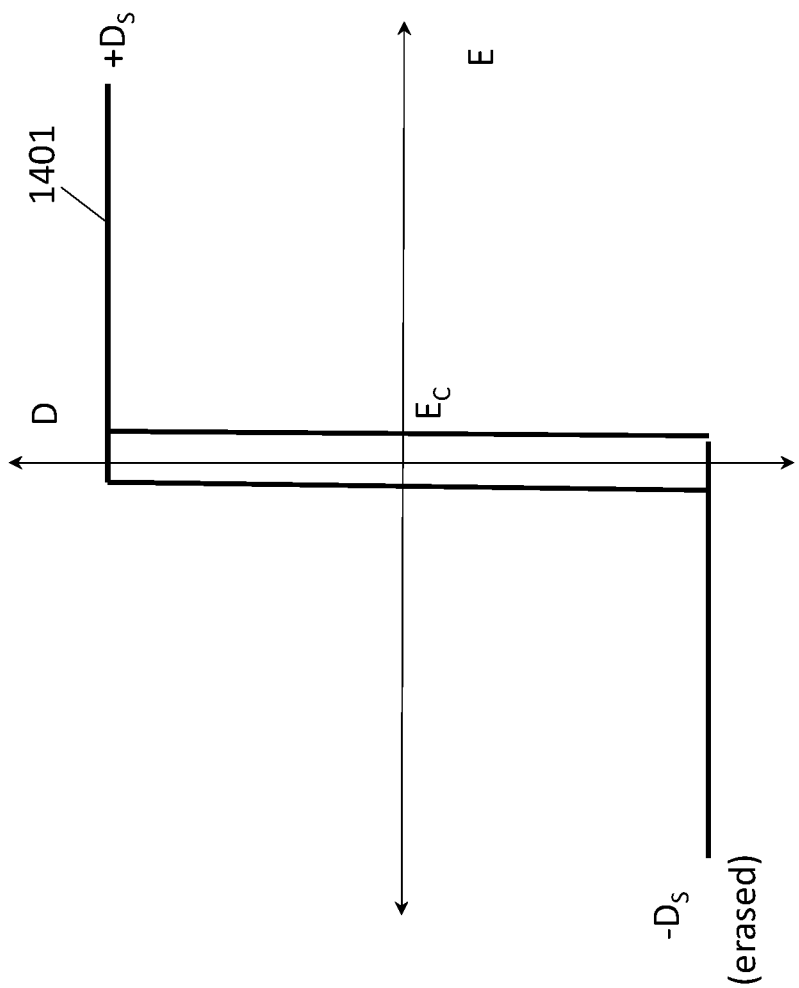
Figure 15:
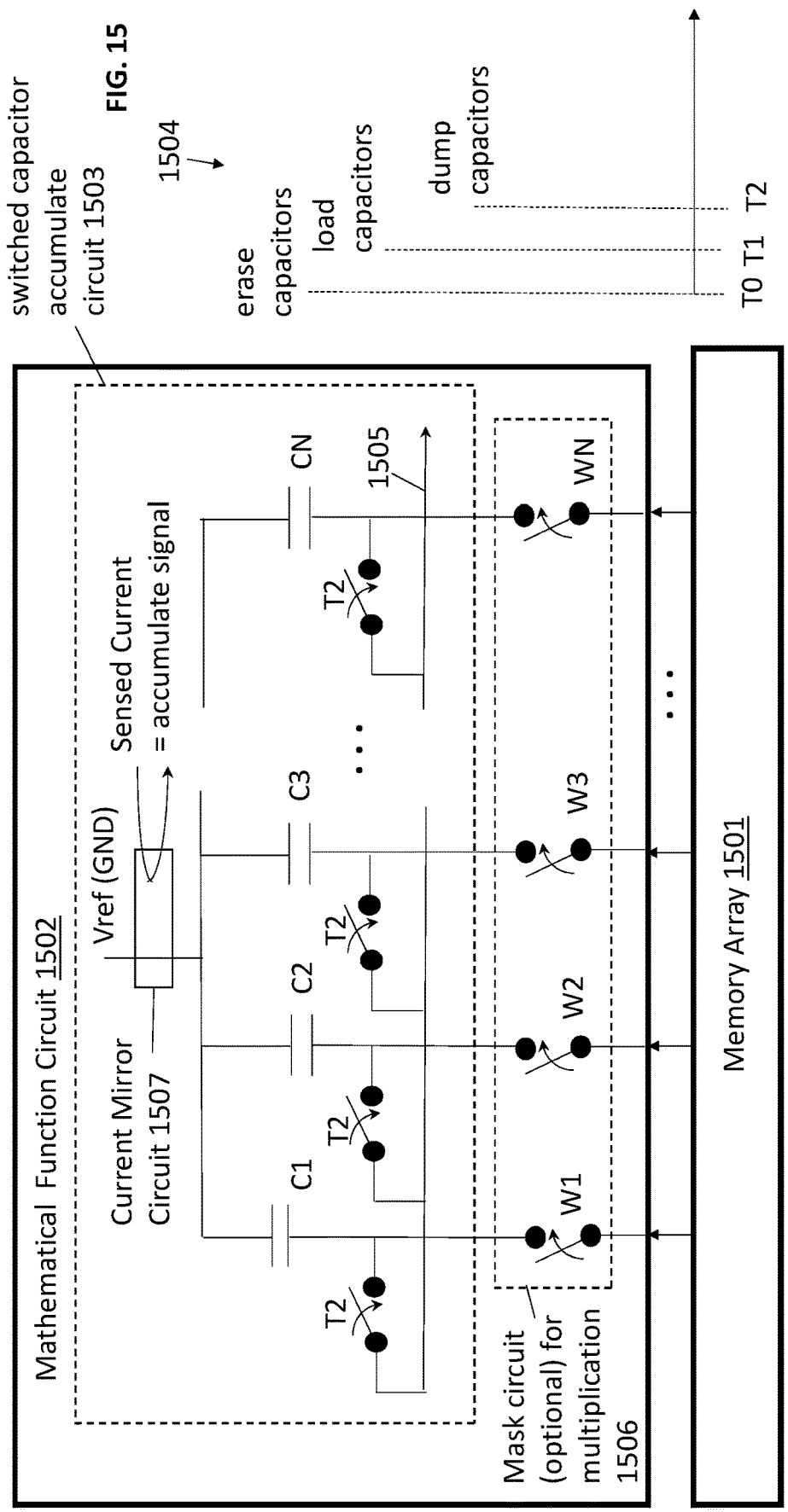
Figure 16A:
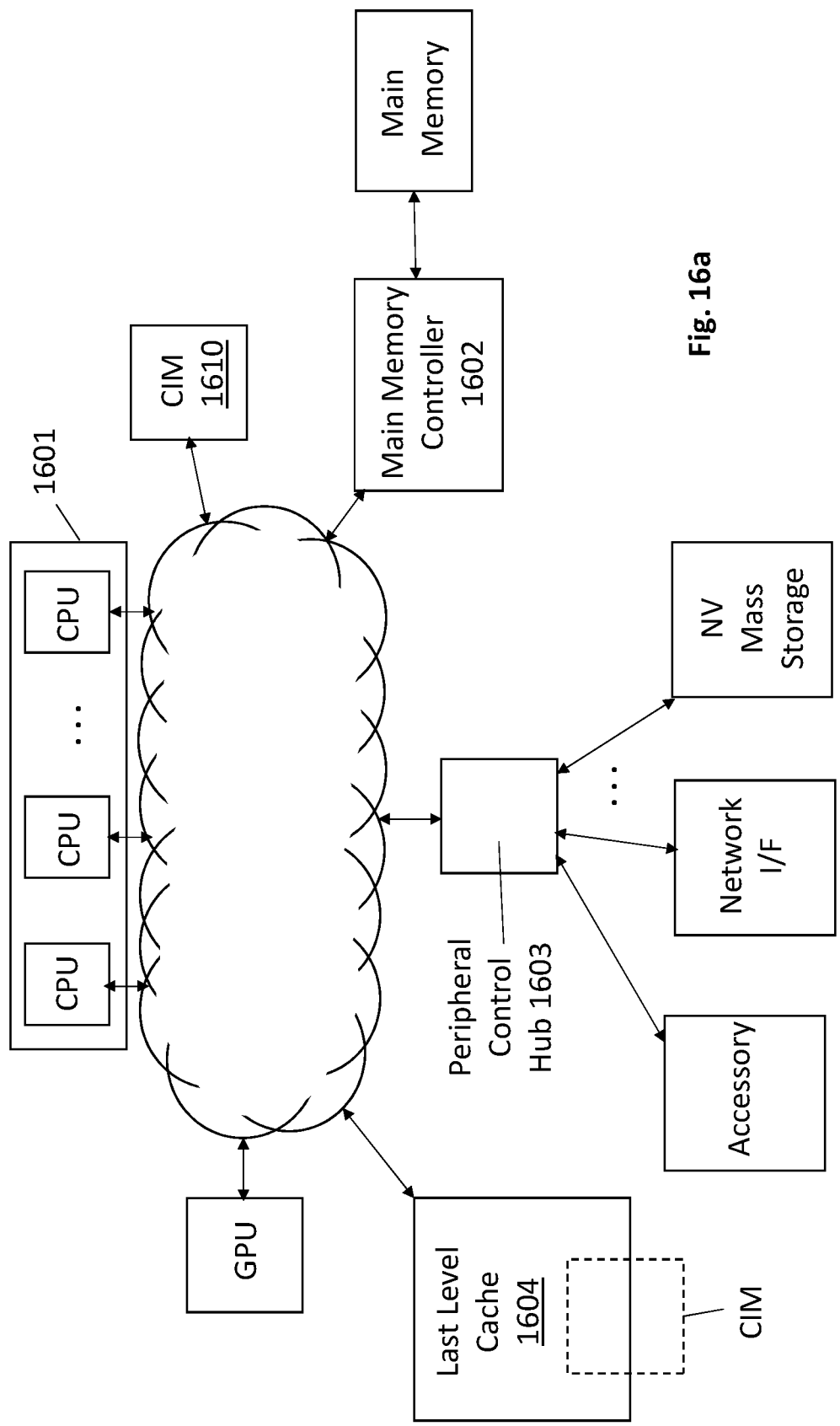
Figure 16B:
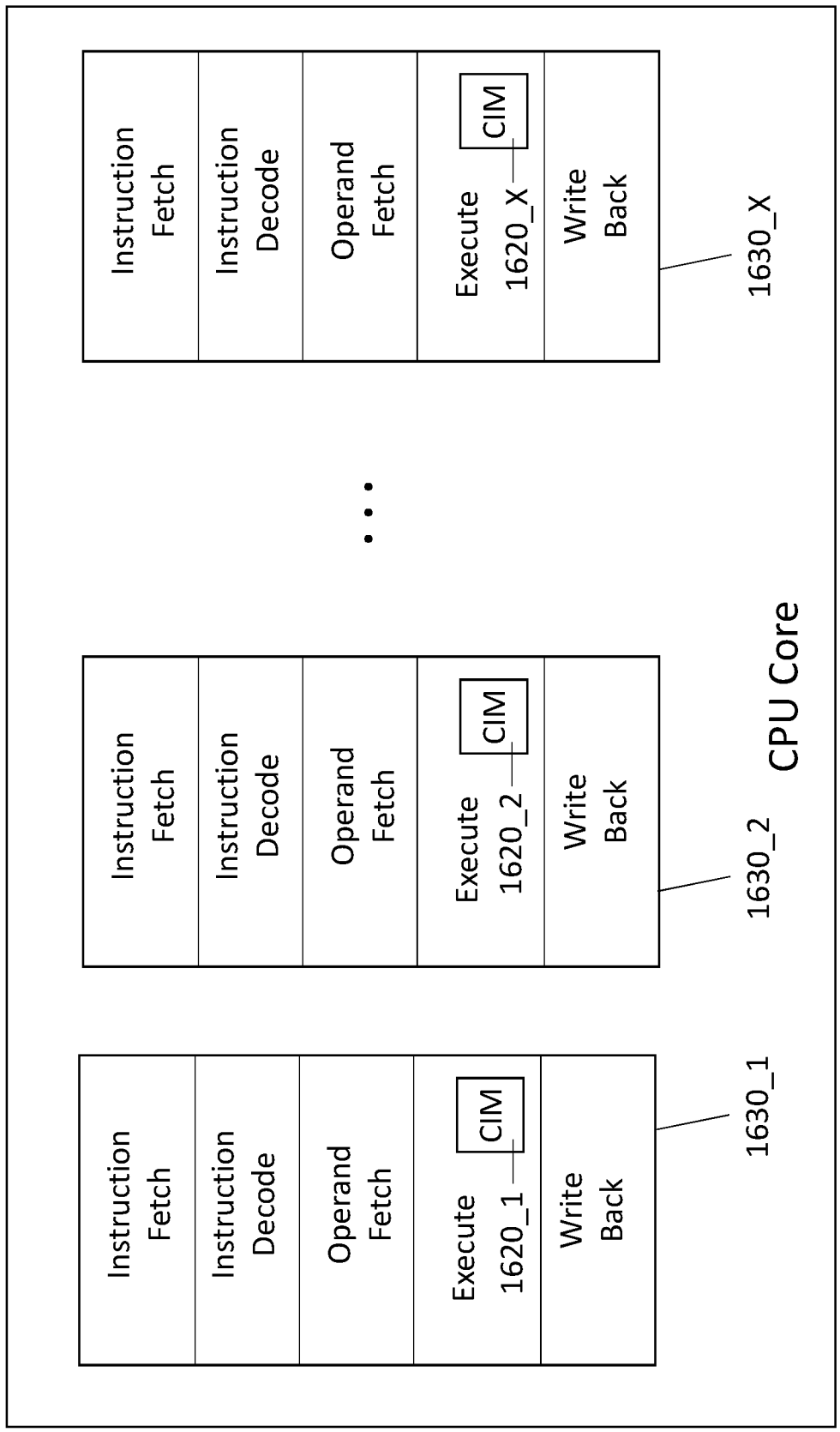
Figure 17:
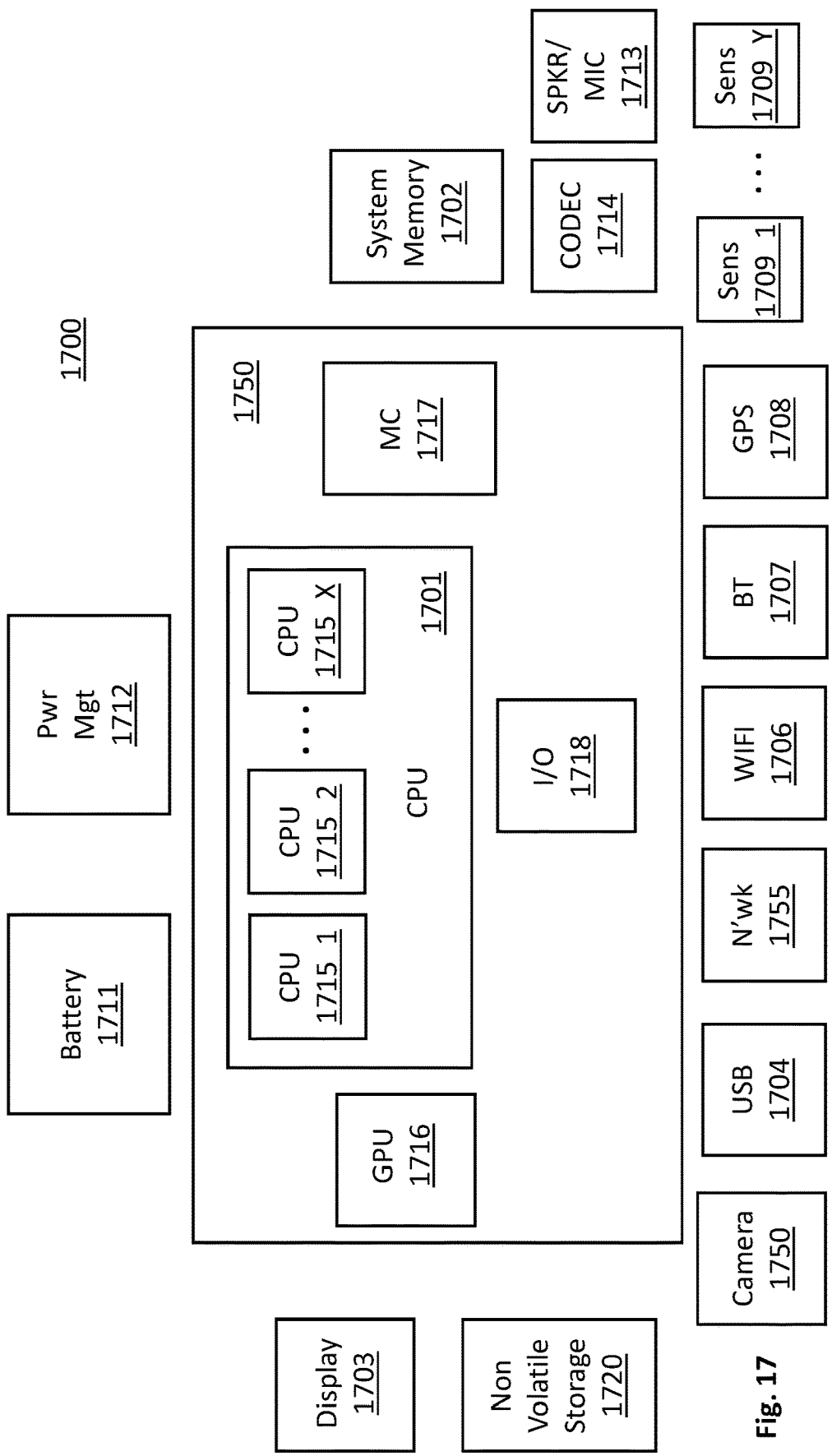

FIG. 13 compares ferroelectric behavior vs. non ferroelectric behavior;

FIG. 14 shows an example of ferroelectric behavior useable to form a binary capacitive device;

FIG. 15 shows a switched capacitor accumulation circuit that includes binary capacitive devices;

FIG. 16a shows different locations where a CIM circuit may located within a processor;

FIG. 16b shows CIM execution units within an instruction execution pipeline;

FIG. 17 shows a computing system.

Figure 1:
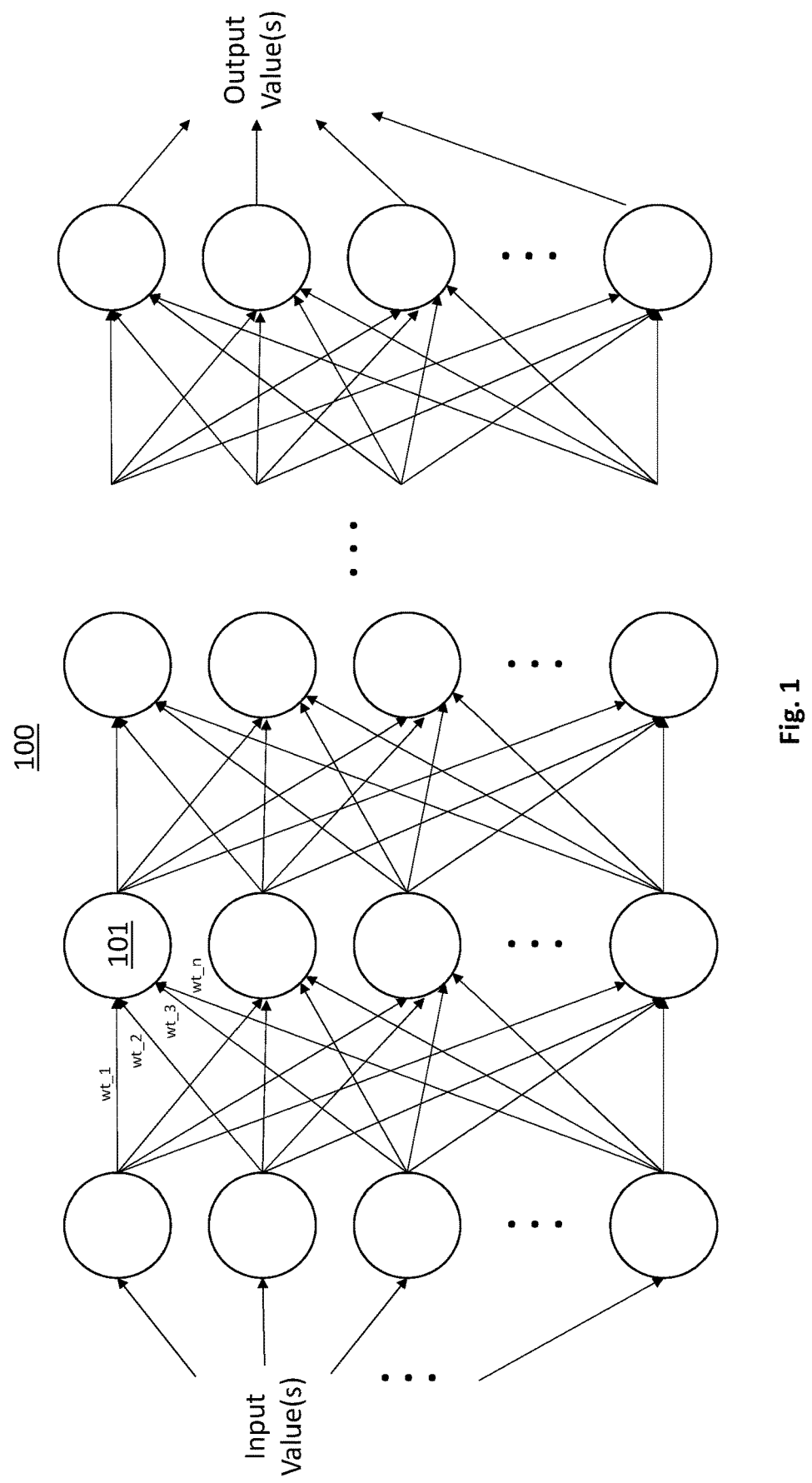
FIG. 1 shows a neural network.
Figure 2C:
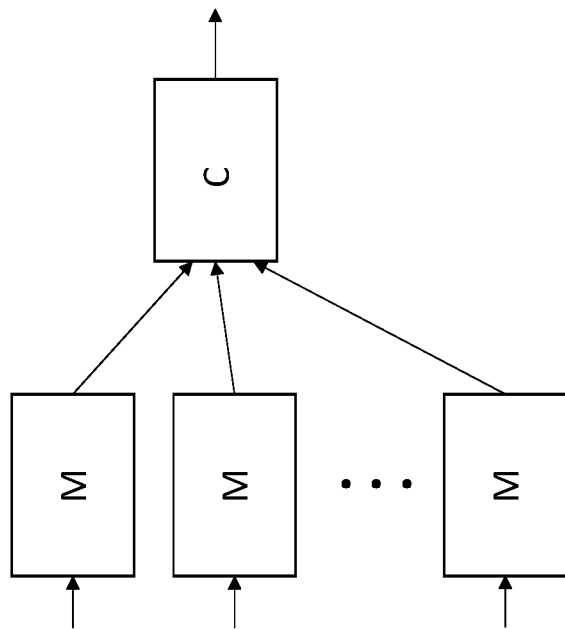
Figure 2A:
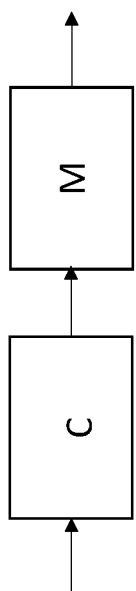
Figure 2B:
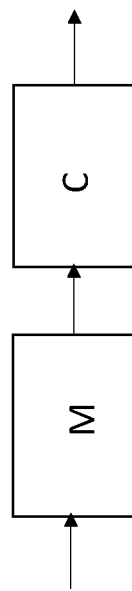
Figure 2E:
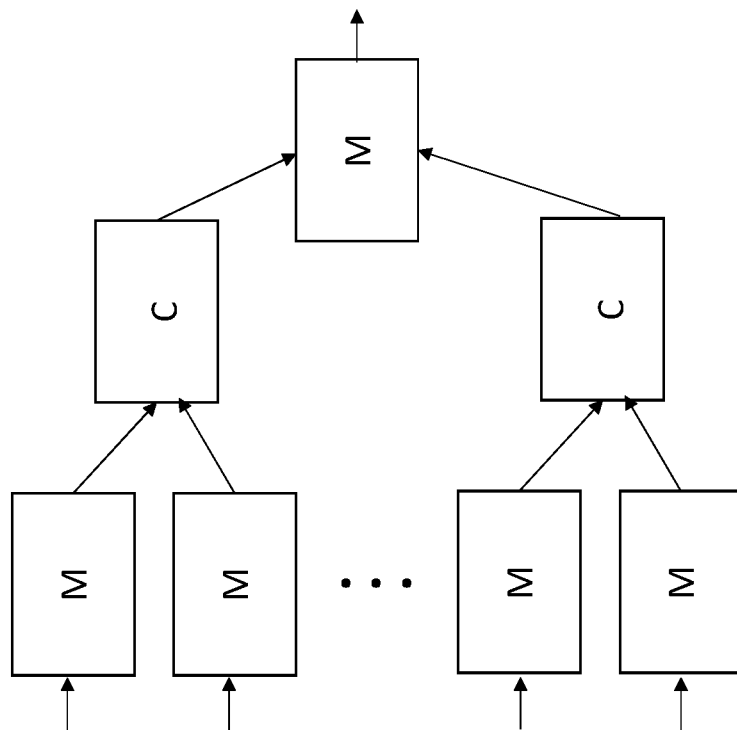
Figure 2D:
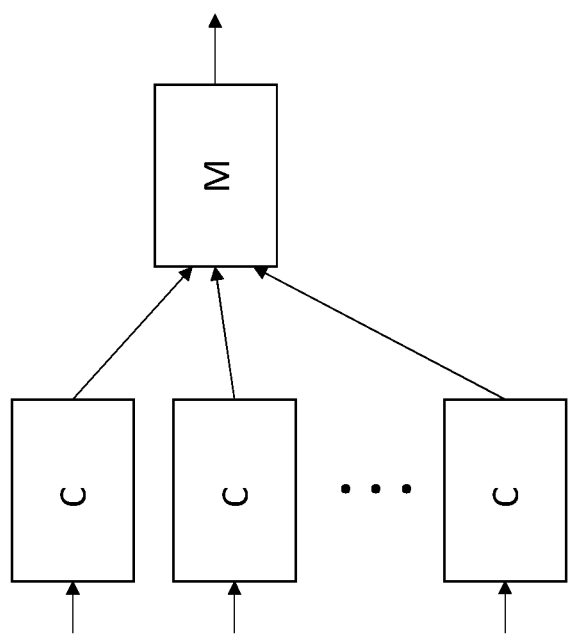

DETAILED DESCRIPTION 1.0 Introduction to Neural Networks and Compute-in-Memory (CIM) Circuits A neural network is the basic computational structure for Artificial Intelligence (AI) applications. FIG. 1 depicts an exemplary neural network 100. As observed in FIG. 1 the inner layers of a neural network can largely be viewed as layers of neurons that each receive weighted outputs from the neurons of other (e.g., preceding) layer(s) of neurons in a mesh-like interconnection structure between layers. The weight of the connection from the output of a particular preceding neuron to the input of another subsequent neuron is set according to the influence or effect that the preceding neuron is to have on the subsequent neuron (for ease of drawing only one neuron 101 and the weights of input connections are labeled). Here, the output value of the preceding neuron is multiplied by the weight of its connection to the subsequent neuron to determine the particular stimulus that the preceding neuron presents to the subsequent neuron.

A neuron's total input stimulus corresponds to the combined stimulation of all of its weighted input connections. According to various implementations, the combined stimulation is calculated as a multi-dimensional (e.g., vector) multiply accumulate operation. Here, output values from preceding neurons are multiplied by their respective weights to produce a set of products. The set of products are then accumulated (added) to generate the input stimulus to the receiving neuron. A (e.g., non-linear or linear) mathematical function is then performed using the stimulus as its input which represents the processing performed by the receiving neuron. That is, the output of the mathematical function corresponds to the output of the neuron which is subsequently multiplied by the respective weights of the neuron's output connections to its following neurons. The neurons of some extended neural-networks, referred to as "thresholding" neural networks, do not trigger execution of their mathematical function unless the neuron's total input stimulus exceeds some threshold. Although the particular exemplary neural network of FIG. 1 is a purely "feed forward" structure, other neural networks may exhibit some backwardization or feedback in their data flows.

Notably, generally, the more connections between neurons, the more neurons per layer and/or the more layers of neurons, the greater the intelligence the network is capable of achieving. As such, neural networks for actual, real-world artificial intelligence applications are generally characterized by large numbers of neurons and large numbers of connections between neurons. Extremely large numbers of calculations (not only for neuron output functions but also weighted connections) are therefore necessary in order to process information through a neural network.

Although a neural network can be completely implemented in software as program code instructions that are executed on one or more traditional general purpose central processing unit (CPU) or graphics processing unit (GPU) processing cores, the read/write activity between the CPU/GPU core(s) and system memory that is needed to perform all the calculations is extremely intensive. In short, the overhead and energy associated with repeatedly moving large amounts of read data from system memory, processing that data by the CPU/GPU cores and then writing resultants back to system memory, across the many millions or billions of computations needed to effect the neural network is far from optimal.

In order to dramatically improve upon this inefficiency, new hardware architectures are being proposed that dramatically reduce the computational overhead associated with implementing a neural network with a traditional CPU or GPU.

One such electronic circuit is a "compute-in-memory" (CIM) circuit that tightly integrates mathematical computation circuits with memory circuitry (and/or integrates memory cells in an arrangement of mathematical computation circuits). FIGS. 2a through 2g show some possible, exemplary CIM unit cell blocks. Here, data that is stored in the memory cells (M) of a CIM circuit, which may correspond, e.g., to a connection weight, neuron output value, a product of a neuron output value and its corresponding weight, a neuron input stimulus, etc. is computed upon by mathematical computation circuitry (C) that physically resides near the memory cell where the data was stored. Likewise, data that is stored after being computed is generally stored in memory cell(s) that physically reside near the mathematical computation circuitry that calculated the data. The mathematical computation circuits may perform digital (binary logic) computations, linear/analog computations and/or some combination of the two (mixed signal computations). To the extent the CIM circuit computes both in digital and analog domains, the CIM circuit may also include analog-to-digital circuits and/or digital-to-analog circuits to convert between the two domains. For simplicity such circuits are not depicted in FIGS. 2a through 2g.

Here, for example, the mathematical computation circuitry that implements the mathematical function of a particular neuron may be physically located: i) near the memory cell(s) where its output value is stored; ii) near the memory cells where its output connection weights are stored; iii) near the memory cells where its input stimulus is stored; iv) near the memory cells where its preceding neurons' output values are stored; v) near the memory cells where its input connection weights are stored; vi) near the memory cells where the products of the neuron's preceding neurons' output values and their respective weights are stored; etc. Likewise, the input and/or output values to/from any particular connection may be stored in memory cells that are near the mathematical computation circuitry that multiplies the connection's weight by its input value.

By chaining or otherwise arranging large numbers of CIM unit cells (such as any one or more of the CIM unit cells of FIGS. 2a through 2g and/or variations of them) consistent with the discussion above in a pattern that effects a neural network an overall CIM neural network hardware circuit can be realized. Importantly, by keeping the memory cells that store data in close proximity to the circuits that generate and/or perform calculations on the data, e.g., in minimal distances achievable by a leading edge semiconductor logic and/or memory manufacturing process, the efficiency at which information can be processed through a CIM neural network is dramatically superior to an approach that implements a neural network entirely in software on a traditional computer system. Again, note that the unit cells of FIGS. 2a through 2g are only exemplary and CIM circuits having other structures are also possible.

FIGS. 3a and 3b present two exemplary high level CIM circuit architectures. As observed in FIGS. 3a and 3b, both CIM circuits include a memory array 301 that is coupled to mathematical function circuitry 302. During a first phase values are written into the memory array 301. During a second phase values are read from the memory array 301 (commonly multiple values are read in parallel). During a third phase the mathematical function circuitry 302 performs computations on the values that were read from the memory array 301. Often, the mathematical circuitry 302 has one or more outputs that represent the output values of one or more neurons in the neural network.

Here, irrespective of whether the CIM circuit of FIG. 3a or 3b is purely binary, operates with more than two discrete levels or is a purely linear/analog circuit, and/or, irrespective of exactly what kinds of values are stored in the memory array 301 (e.g., just connection values, connection values and weights, products of connection values and weights, etc.), both the mathematical circuitry 302 and the precise interconnection structure between the memory array 301 and the mathematical circuitry 302 may be designed according to a number of different architectures.

Generally, however, the memory array 301 and mathematical circuitry 302 are designed to implement a (e.g., large scale) vector multiply accumulate operation in order to determine a neuron's input stimulus. Again, the multiplication of the connection values against their respective weights corresponds to the multiply operation and the summation of the resultant end-products corresponds to the accumulate operation.

According to the first architecture of FIG. 3a, the multiply operation is performed explicitly with multiplication circuitry that precedes the memory array 301a and/or is effectively performed by the manner in which the memory array 301a is accessed (e.g., during a memory read). The mathematical function circuitry 302a then determines the accumulated value (an accumulated value may be presented on a read data line that the mathematical function circuitry senses). In the architecture of FIG. 3a, a vector of weight values is processed by circuitry that precedes the memory array (e.g., a row decoder of the memory array).

By contrast, according to the architecture of FIG. 3b, the mathematical function circuitry 302b determines both the multiplication terms and the accumulation result. That is, the data that is read from the memory array 301b needs to be both multiplied and accumulated by the mathematical function circuitry 302b. As such, a vector of weight values is presented to and processed by the mathematical function circuitry.

Figure 4:
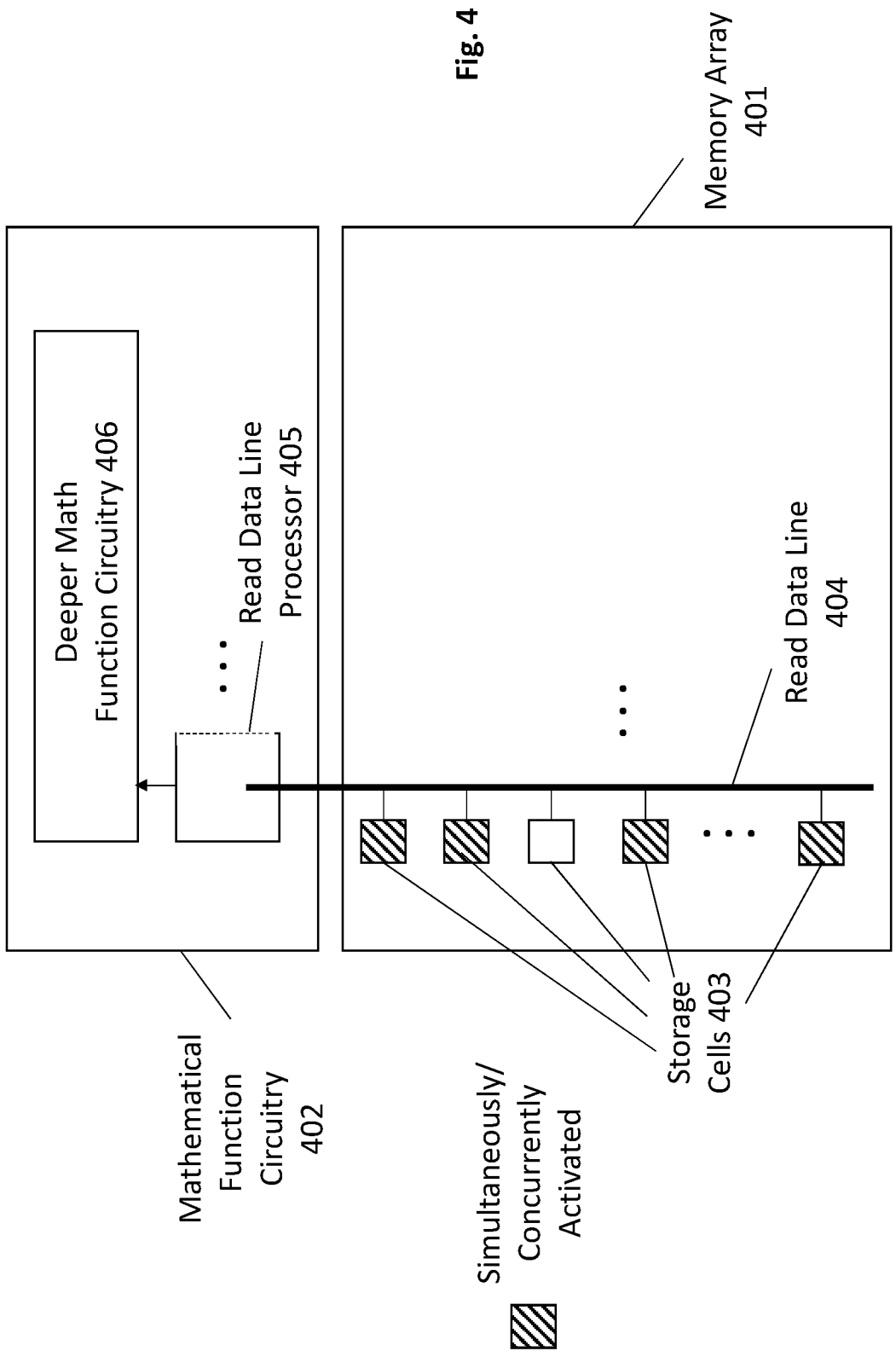
FIG. 4 show simultaneous/concurrent activation of storage cells coupled to a same read data line.

FIG. 4 shows another more detailed hardware design that can be utilized a CIM having the architecture of FIG. 3a or 3b. As observed in FIG. 4, the memory array 401 includes an array of memory cells 403, where, e.g., memory cells associated with a same memory dimension, such as an array column, are coupled to a same read data line 404. As is known in the art, in a traditional memory, memory cells that are coupled to a same read data line (such as memory cells along a same column that are coupled to a same bit line) can only be accessed one at a time. That is, e.g., only one row is activated during a read so that the data of only one cell is sensed on the bit line that is coupled to other cells along different rows.

By contrast, in the architecture of FIG. 4, multiple cells 403 that are coupled to a same read data line 404 can be simultaneously or at least concurrently activated during a same read operation so that the data stored by the multiple cells affects the voltage and/or current on the read data line 404 which, in turn, reflects some combined state of the cells' data. According to one application which can be used by the CIM architecture of either FIG. 3a or FIG. 3b, the CIM circuit utilizes more than two discrete voltage levels (e.g., four levels, eight levels, etc.) and the activation of multiple binary cells are combined on the same read data line 404 to establish one of these levels.

According to another application for use in the architecture of FIG. 3a, the combined state corresponds to an accumulation value. That is, the read data line 404 presents an accumulation value that is sensed by the mathematical function circuitry. As just one example, in CIM circuit that implements a purely digital neural network, connection values are either a 1 or a 0 and weights are either a 1 or a 0. During a multiply accumulate operation, the values of the different connections that feed into a same neuron are stored in the different memory cells 403 of a same column.

A vector of the weight values is then presented to the row decoder of the memory array 401 which only activates, for a read operation, those rows whose corresponding vector element has a weight of 1. The simultaneous/concurrent read of the multiple selected rows causes the read data line 404 to reach a value that reflects the accumulation of the values stored in the memory cells of only the selected rows. In essence, the selection of only the rows having a weight of 1 corresponds to a multiply operation and the simultaneous read of the selected rows onto the same read data line 404 corresponds to an accumulate operation. The accumulated value on the read data line 404 is then presented to the mathematical function circuitry 402 which, e.g., senses the accumulated value and then performs a subsequent math function such as a neuron math function.

As depicted in FIG. 4, read data line processing circuitry 405 is positioned toward the front end of the mathematical circuitry 402 to sense read data line values. The read data line processing circuitry 405 may be partitioned in various ways. For example, there may be one instance of read data line processing circuitry per read data line, or, there may be one instance of read data line processing circuitry for multiple read data lines (e.g., to accumulate values across multiple read data lines). If the mathematical function circuitry 402 is to simultaneously process the math functions of multiple neurons the read data line processing circuitry 405 may also be partitioned such that read data line processing operations for different neurons are isolated from one another.

Read data line processing circuitry 405 is then coupled to deeper math function circuitry 406 which, e.g., performs neuron math functions. In various embodiments, the boundary between the read data line processing circuitry 405 and the deeper math circuitry 406 is crossed with an input stimulus value for a neuron. The deeper math function circuitry 406 may also be partitioned, e.g., along boundaries of different neurons and/or different math functions.

It is important to point out that the hardware architecture of FIG. 4 is just one example of many different hardware architectures that are possible according to the more general hardware architectures of FIGS. 3a and 3b.

2.0 Embedded DRAM (eDRAM) CIM Circuit Memory Array

Figure 5:
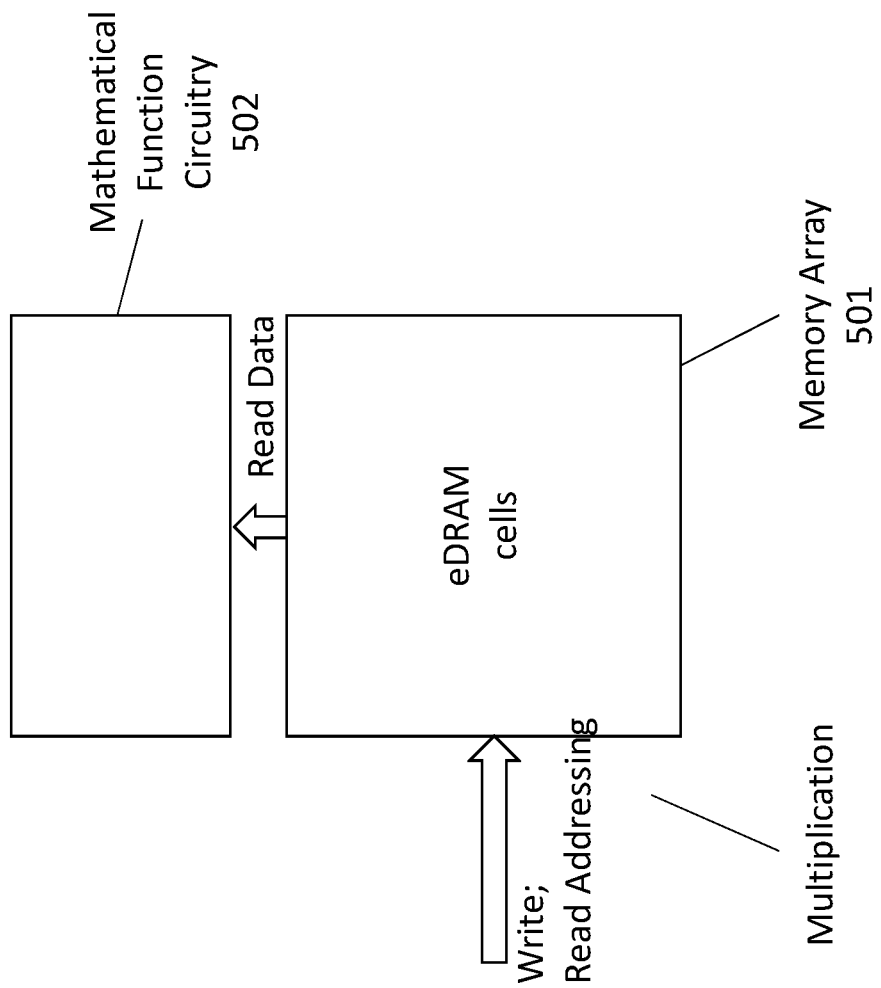
FIG. 5 shows a CIM circuit having a memory array composed of eDRAM cells.

FIG. 5 shows a CIM circuit having an eDRAM memory array 501. As is known in the art, the physical storage elements (capacitors) of an eDRAM memory are formed in a semiconductor chip's metal/insulator wiring level(s) rather than its semiconductor substrate. Here, for example, metal-insulator-metal (MIM) capacitor structures are formed during manufacture of the chip's metal/dielectric layers to construct the physical storage elements of the eDRAM memory 502. Such capacitors may also be referred to as "back-end-of-line" (BEOL) capacitors owing to their formation in the metal/insulator wiring level(s) irrespective of which exact layer(s) they are integrated within (i.e., they need not be present only in the upper layers). The construction of an eDRAM memory array provides, for example, a CIM circuit memory array that sits "above" other logic transistors of the CIM circuit or other component (e.g., processing core(s), memory controller, etc.) that is integrated on the same semiconductor chip as the CIM circuit.

Figure 6:
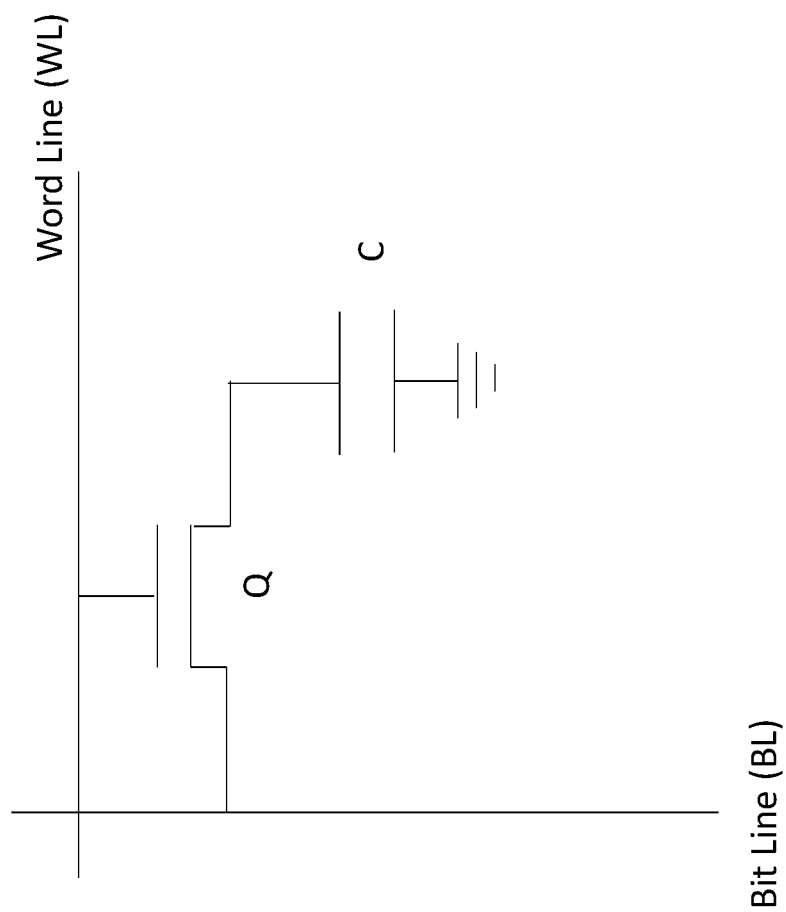
FIG. 6 shows a 1T1C eDRAM cell (prior art)
Figure 7B:
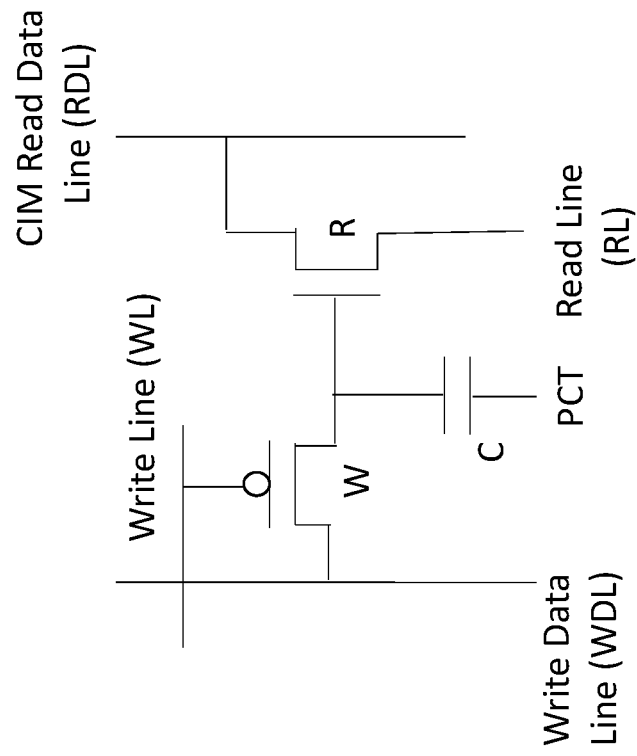
FIGS. 7a, 7b, 7c and 7d show 2T1C eDRAM cells for integration in a memory array of a CIM circuit.
Figure 7A:
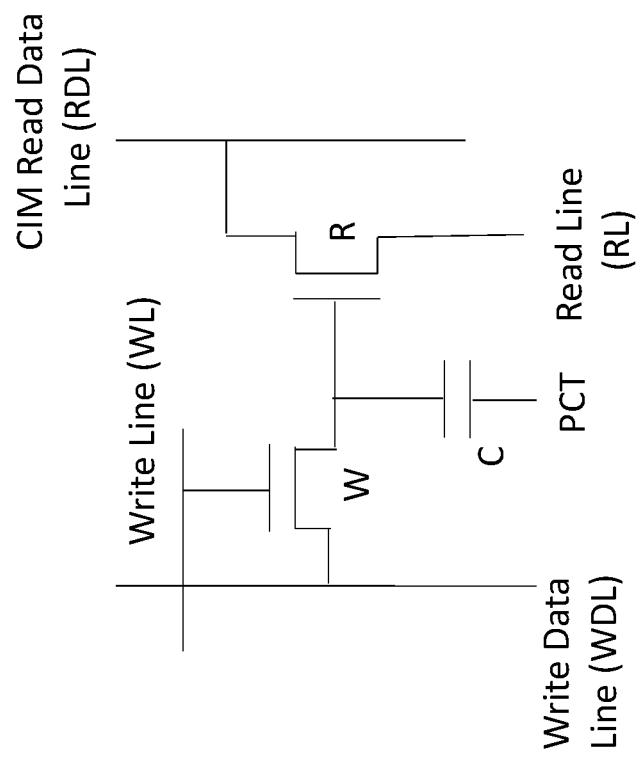
Figures 7C, 7D:
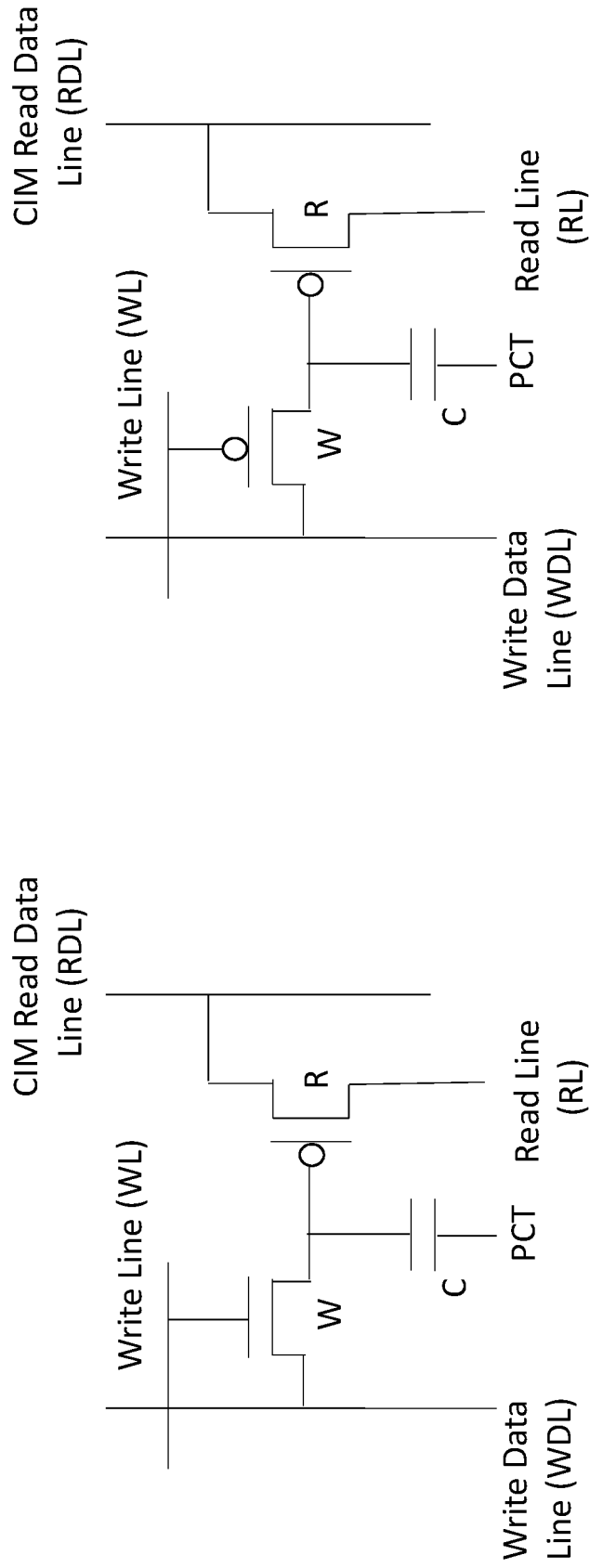

A circuit diagram of a traditional 1T1C eDRAM cell is depicted in FIG. 6. As observed in FIG. 6, the traditional 1T1C eDRAM cell is composed of a single access transistor Q. The single access transistor Q is typically formed in the semiconductor substrate, e.g., directly beneath the capacitor storage element C. As such, the surface area consumption of a 1T1C single cell is approximately that of a single transistor resulting in tight packing of storage cells and correspondingly high density memory storage.

A complication with the traditional 1T1C eDRAM cell of FIG. 6, however, is its "destructive" read process. Here, in order to read the capacitive storage element, charge is depleted from the element which, if left un-replenished, results in loss of stored information. A "refresh" or "write back" of charge is therefore written back into the storage element commensurate with the read to replenish the cell's charge and preserve its stored data. In the case of the 1T1C eDRAM cell of FIG. 6, however, the replenishment must be performed simultaneously with the read (the single transistor Q that is needed to read the cell is also needed to write back the replacement charge).

In the case of a traditional 1T1C eDRAM memory in which only a single storage cell drives a single bit line during a read, the simultaneous replenishment does not pose any data integrity problems. That is, even if the write back affects the bit line voltage during the read, the bit line voltage will still be interpreted correctly.

However, in the case of a CIM circuit where a read of the memory array includes simultaneous/concurrent activation of multiple storage cells that are coupled to a same read data line, if write back charge from one or more of the activated cells also flows into the read data line (and/or such flow is disproportionate across cells) the data sensing process may be corrupted.

A solution is to use a 2T1C eDRAM cell such as any of the 2T1C eDRAM cells depicted in FIGS. 7a through 7d. 2T1C eDRAM cells by themselves are known in the art (and are also referred to as "gain" cells). However, their integration into a CIM memory array to avoid write-back related data corruptions on a common read data line is believed to be novel.

A 2T1C eDRAM cell decouples the write back current path from the read current path so that charge from the write back flows only into the storage element and not onto the read data line, and/or, the write back need not occur during the read (in either case the disruption from the write back is avoided). In the case of the cells 7a and 7b, current is sunk from the read data line (RDL) in direct proportion to the charge stored on the storage element C. By contrast, In the case of the cells of FIGS. 7c and 7d, current is sunk from the read data line (RDL) in inverse proportion to the charge stored on the storage element (C). Regardless, a combined value can be accurately sensed on the read data line if multiple cells simultaneously are activated and refreshed. For example, an accumulation value can readily be determined from the common read data line by sensing the combined sink current from the multiple activated cells.

In operation, a read line (RL) is activated which turns on the read transistor R. The turning on of the read transistor R causes current to be sinked from the read data line as a function of the storage element's charge. In order to perform a refresh or a nominal write, a write line (WL) is activated which turns on the write transistor W. A value that is presented on the write data line (WDL) is then written into the storage element C. As such, the 2T1C eDRAM cell includes five nodes: RL, RDL, WL, WDL and a bias/reference node for the storage element (PCT).

A complication however is the addition of the second transistor as compared to a 1T1C cell which potentially doubles the cell's surface area consumption. Left unchecked, the penalty can potentially reduce the memory array density by approximately 50% as compared to a 1T1C eDRAM based memory array.

A solution is to implement one or both of the storage cell's transistors as thin film transistors (TFTs). As is known in the art, a TFT, like a BEOL capacitor, is formed in the metal/dielectric layering above the semiconductor substrate. Integration of at least one TFT into a 2T1C eDRAM cell can have the effect of largely (if not entirely) eliminating the surface area penalty of the additional transistor. As such, higher density eDRAM memory arrays that also support combined storage cell reads without refresh signal disturbances can be realized.

Figure 8A:
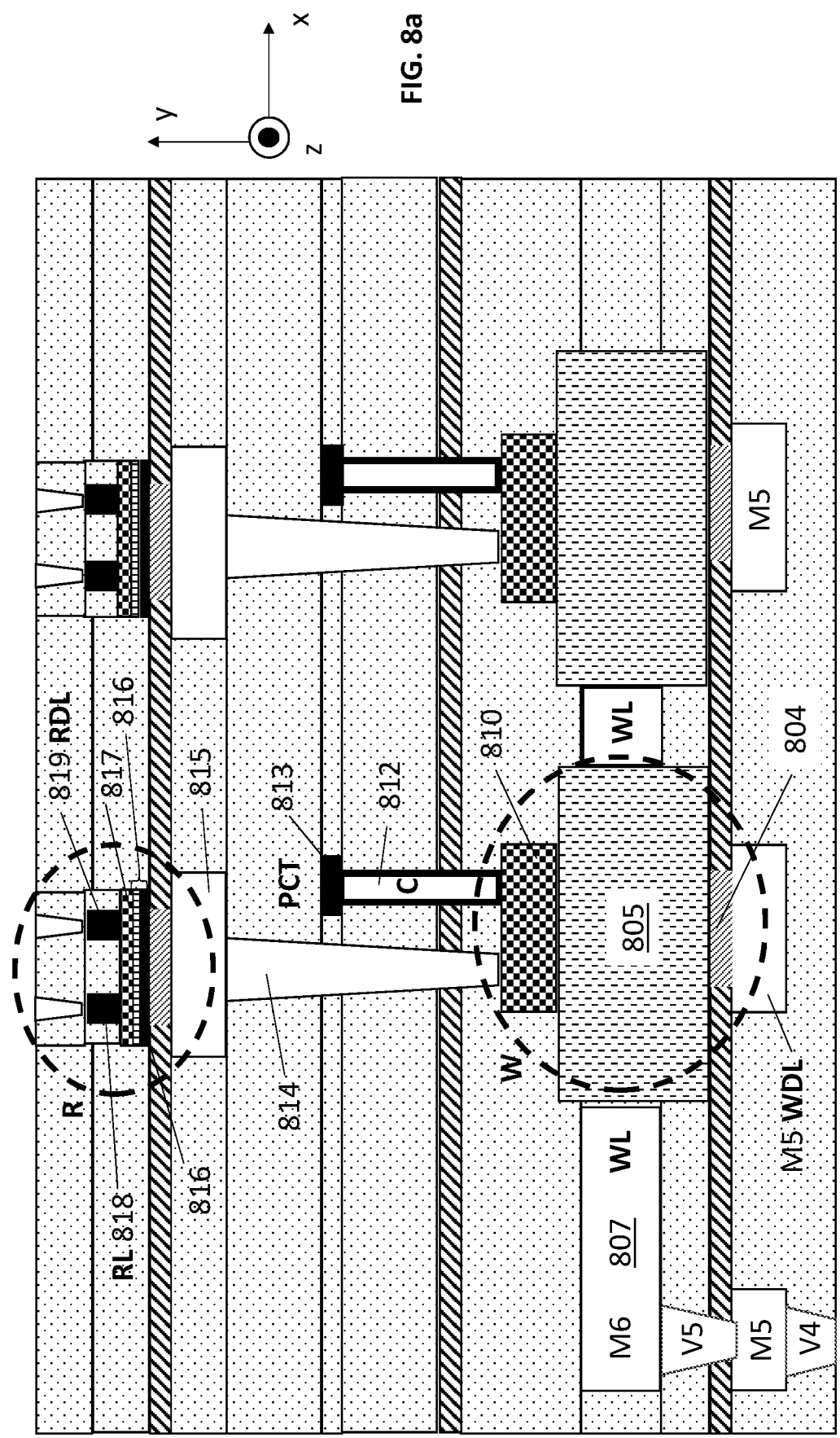
FIGS. 8a and 8b shows a 2T1C eDRAM cell structure formed with BEOL capacitors and thin film transistors (TFTs)
Figure 8B:
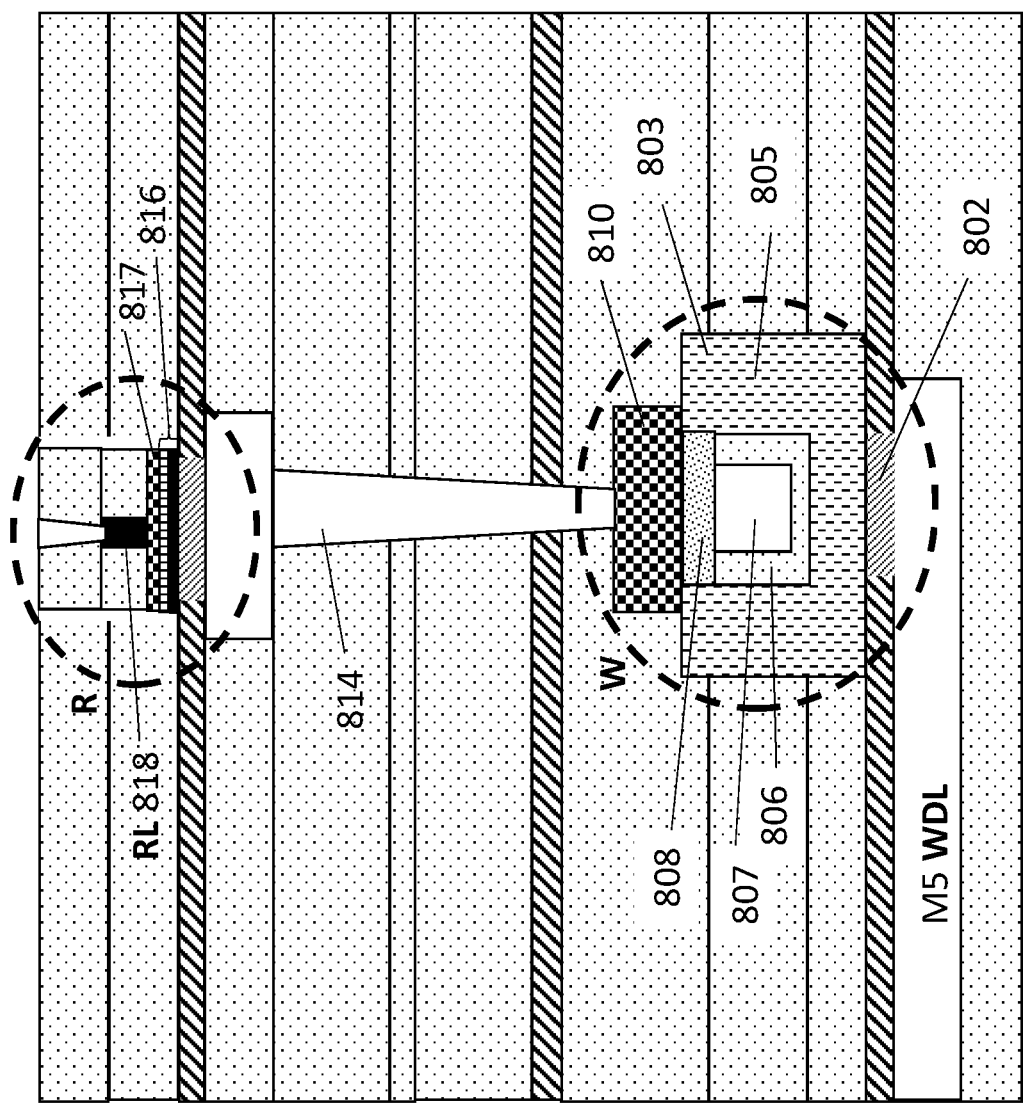

FIGS. 8a and 8b show an embodiment of a pair of BEOL 2T1C eDRAM cells as described just above. As depicted, the write transistor W is integrated beneath the BEOL capacitor C in the semiconductor chip's metal/dielectric layering and the read transistor R is integrated above the capacitor in the semiconductor chip's metal/dielectric layering. Other embodiments may choose to eliminate one of the TFT transistors in favor of a substrate transistor instead. For example one of the transistors may be formed in the substrate and the other transistor is a TFT transistor that resides above or below the capacitor.

In the particular embodiment of FIGS. 8a and 8b the lower TFT write transistor W is a vertical transistor having a source/drain node 804 beneath the channel material 805 and a drain/source node 810 above the channel material 805. As such, current through the lower W TFT transistor (W) runs vertically through the channel. Referring specifically to FIG. 8b, the gate node 807 of the lower write TFT transistor W is embedded in the transistor's channel 805 and (referring now to FIG. 8a) is connected to a standard metal wire 811 that implements the write line (WL) to which the write transistors of both structures are connected (although in other embodiments cells may be individually written to and are therefore not coupled to a same write line (WL)).

Also, in the particular embodiment of FIGS. 8a and 8b, the upper read TFT transistor (R) is a horizontal transistor. Here, both of the source/drain nodes 817, 818 are positioned on top of the channel material 817. As such, current runs horizontally through the channel.

Figure 9A:
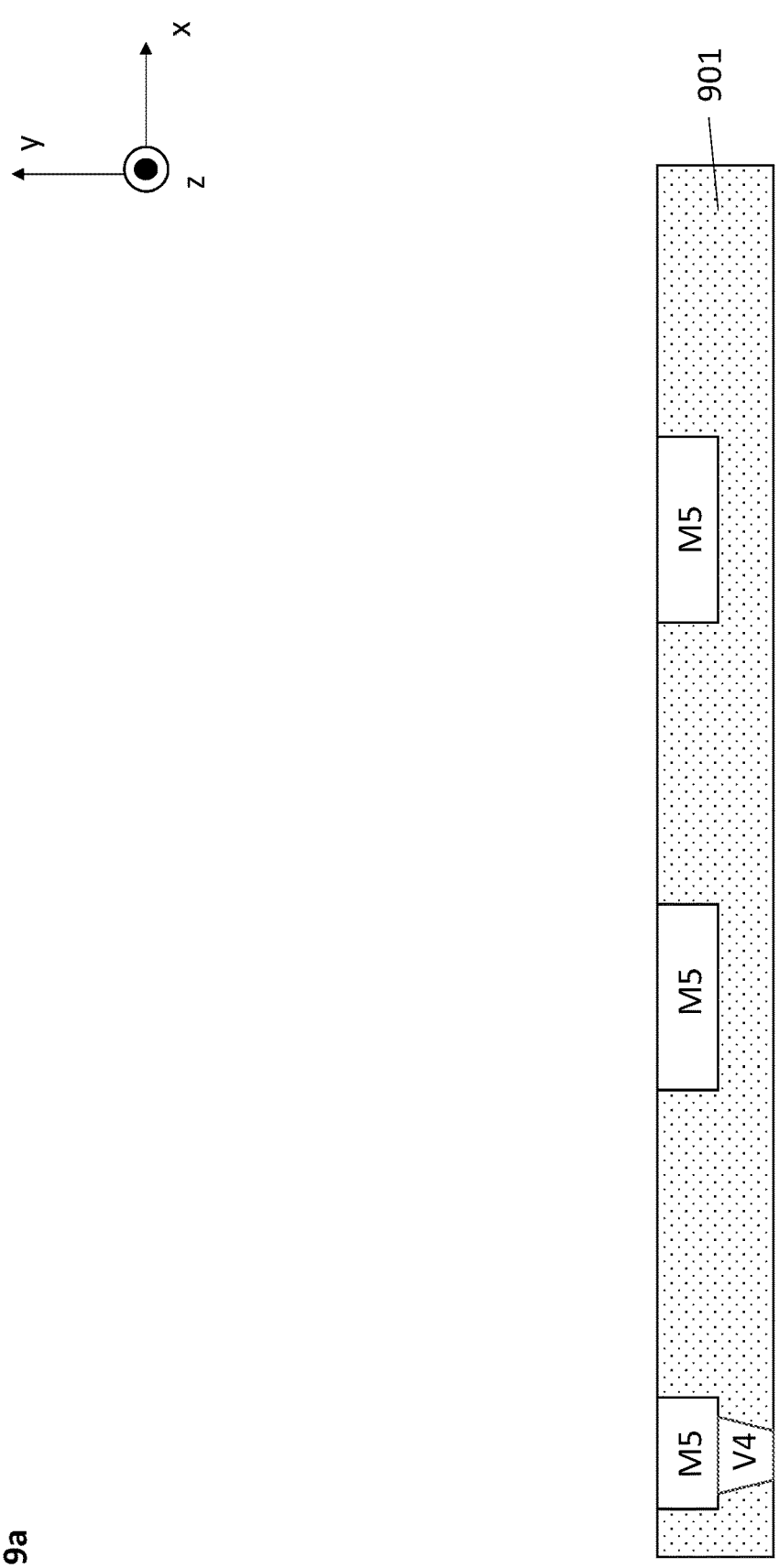
Figure 9B:
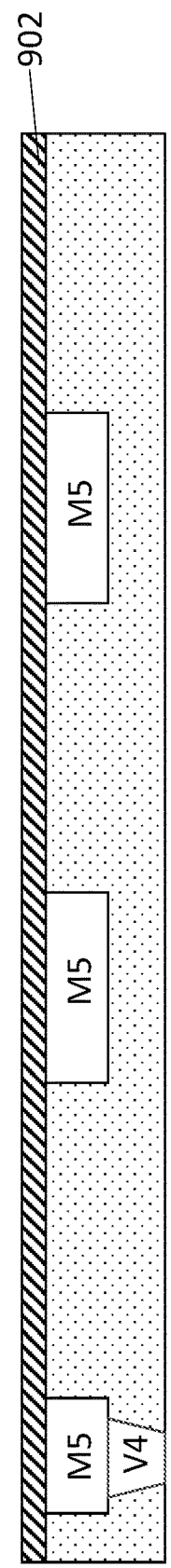
Figure 9C:
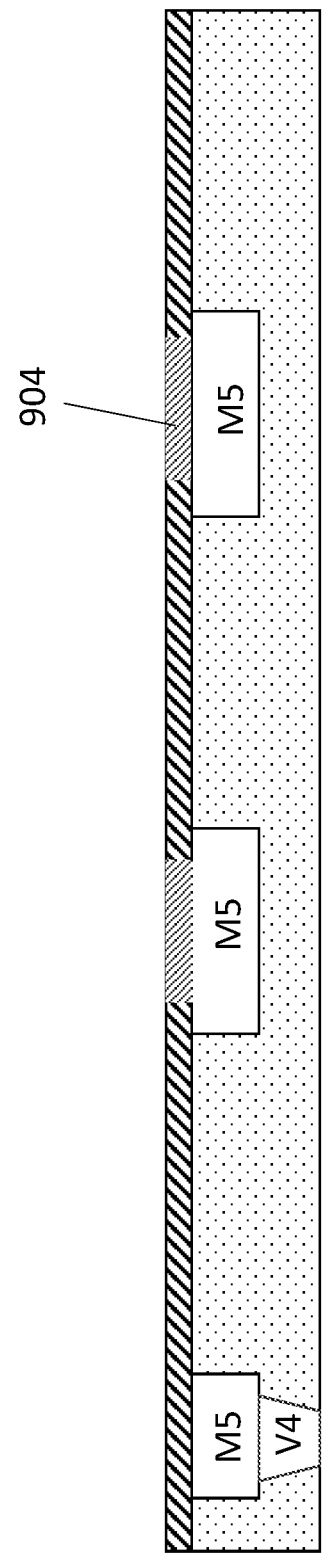
Figure 9D:
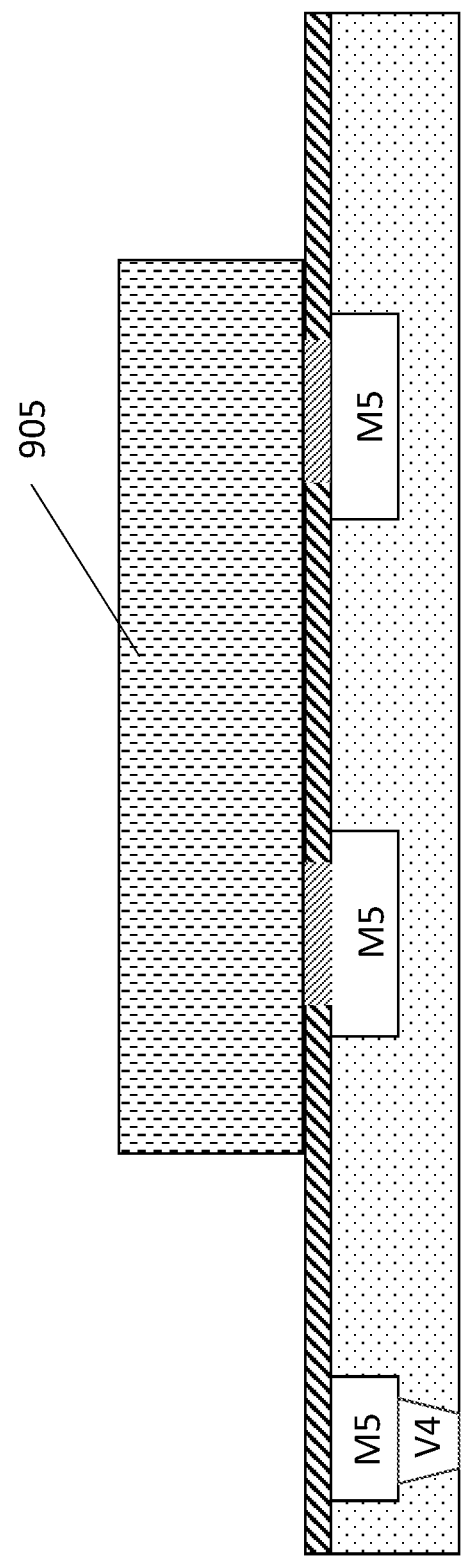
Figure 9E:
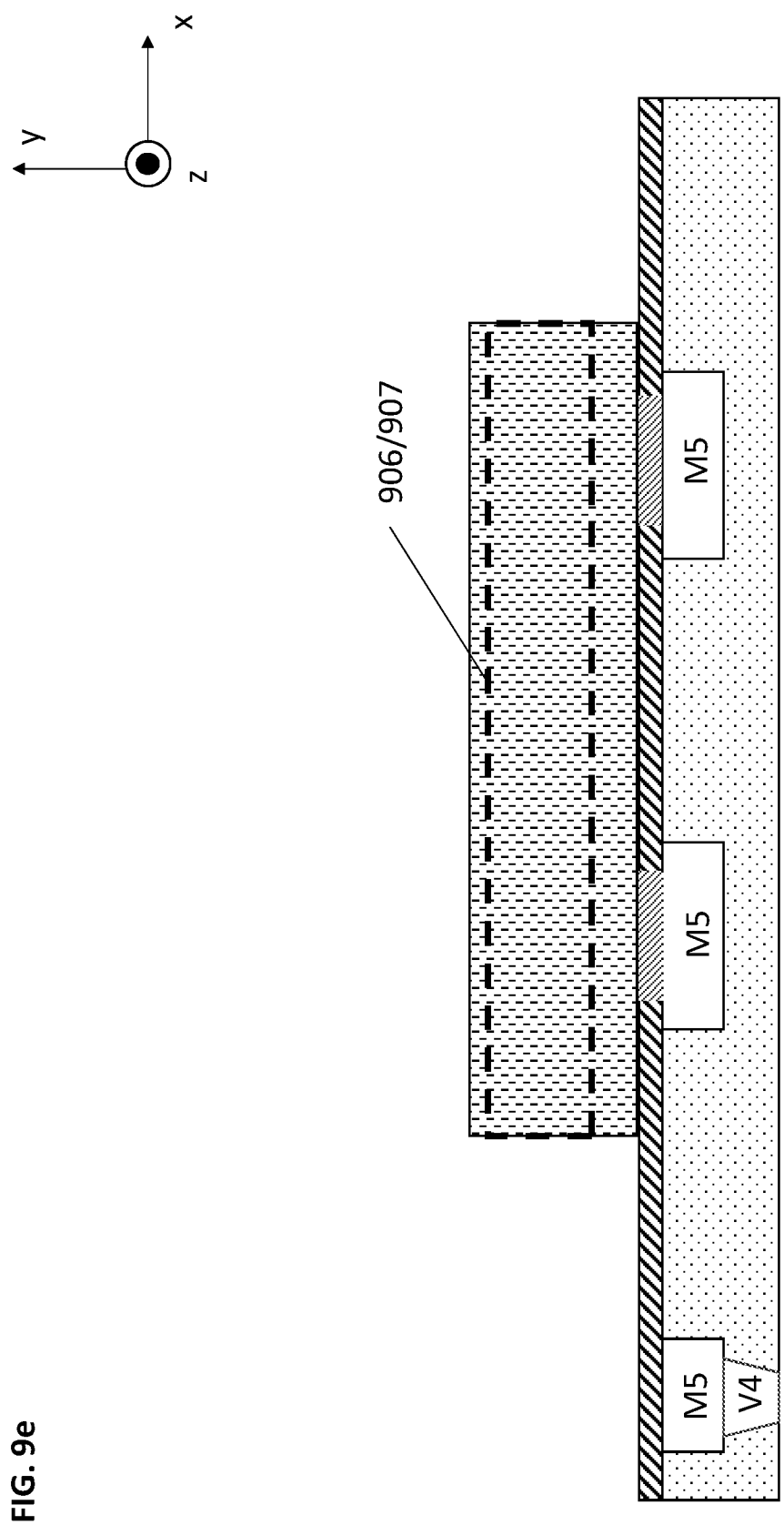
Figure 9G:
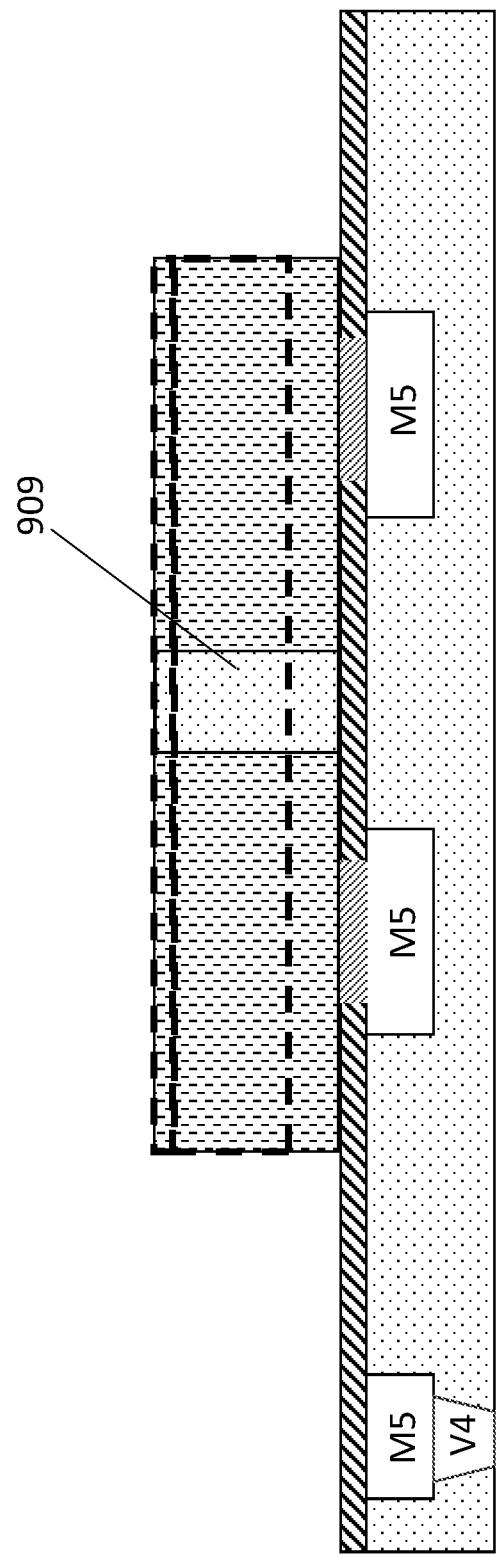
Figure 9H:
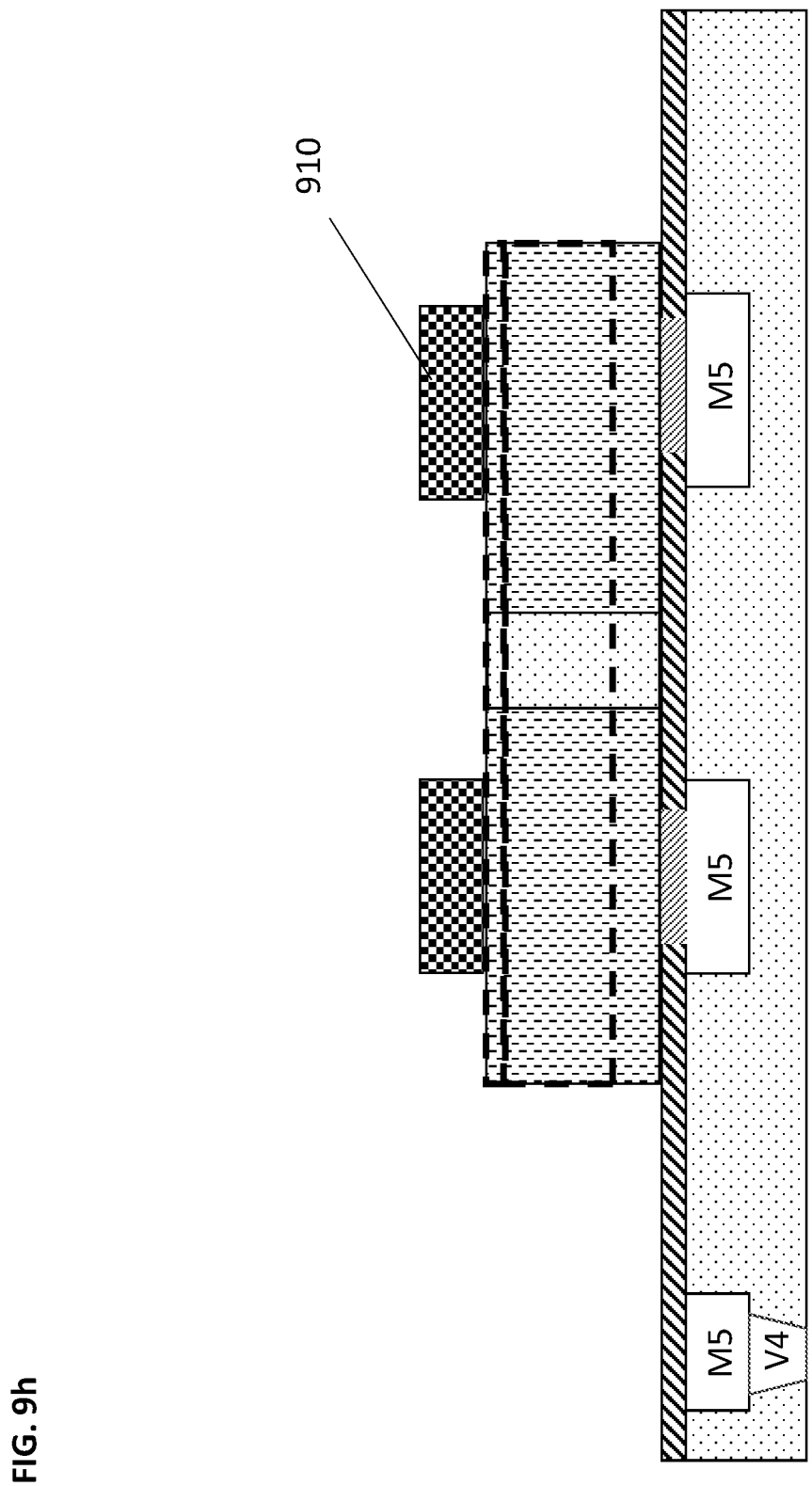
Figure 9I:
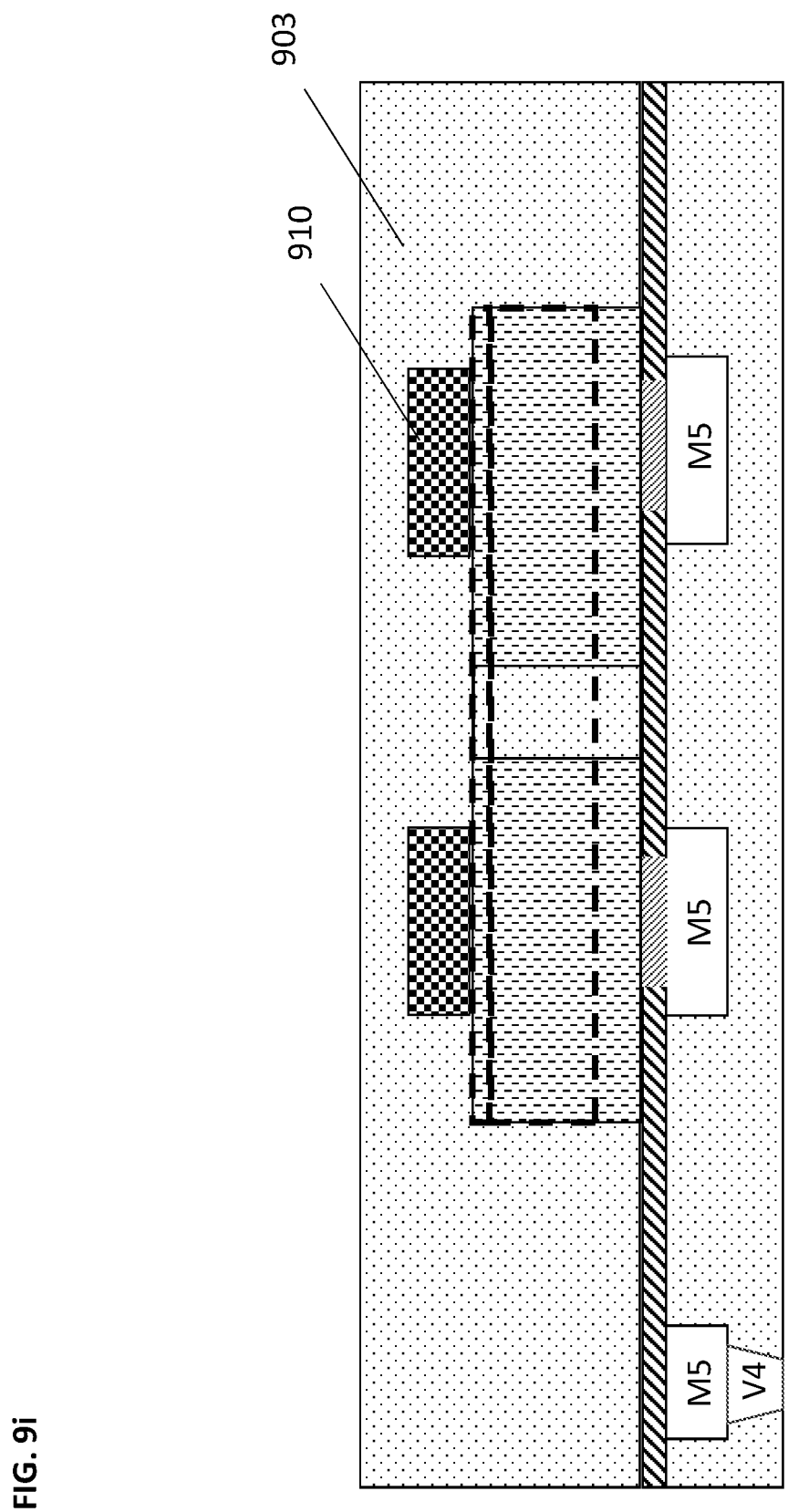
Figure 9J:
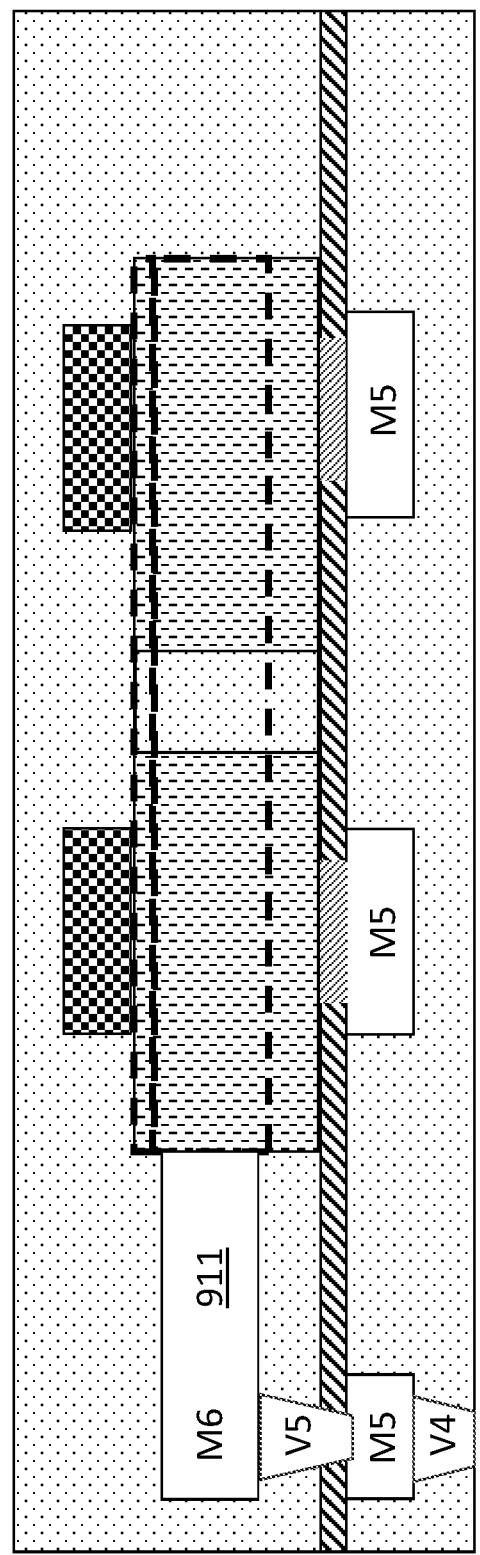
Figure 9K:
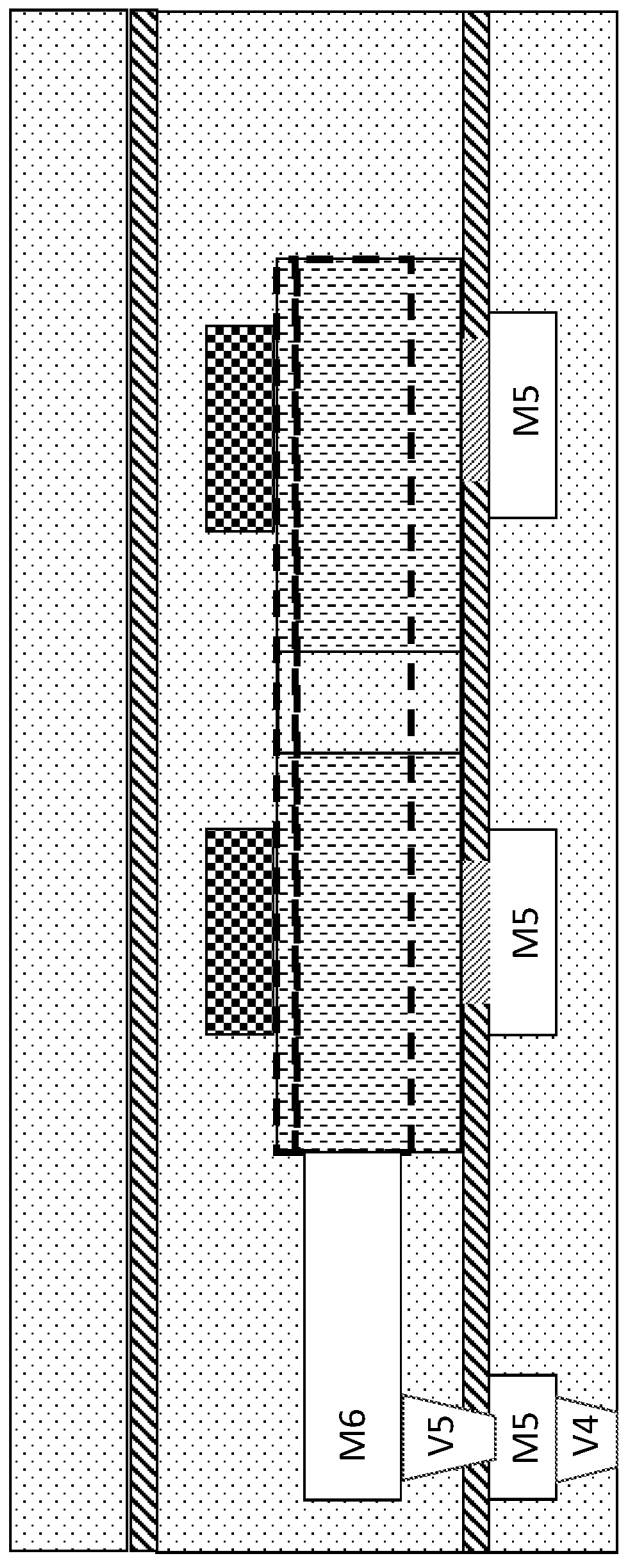
Figure 9I:
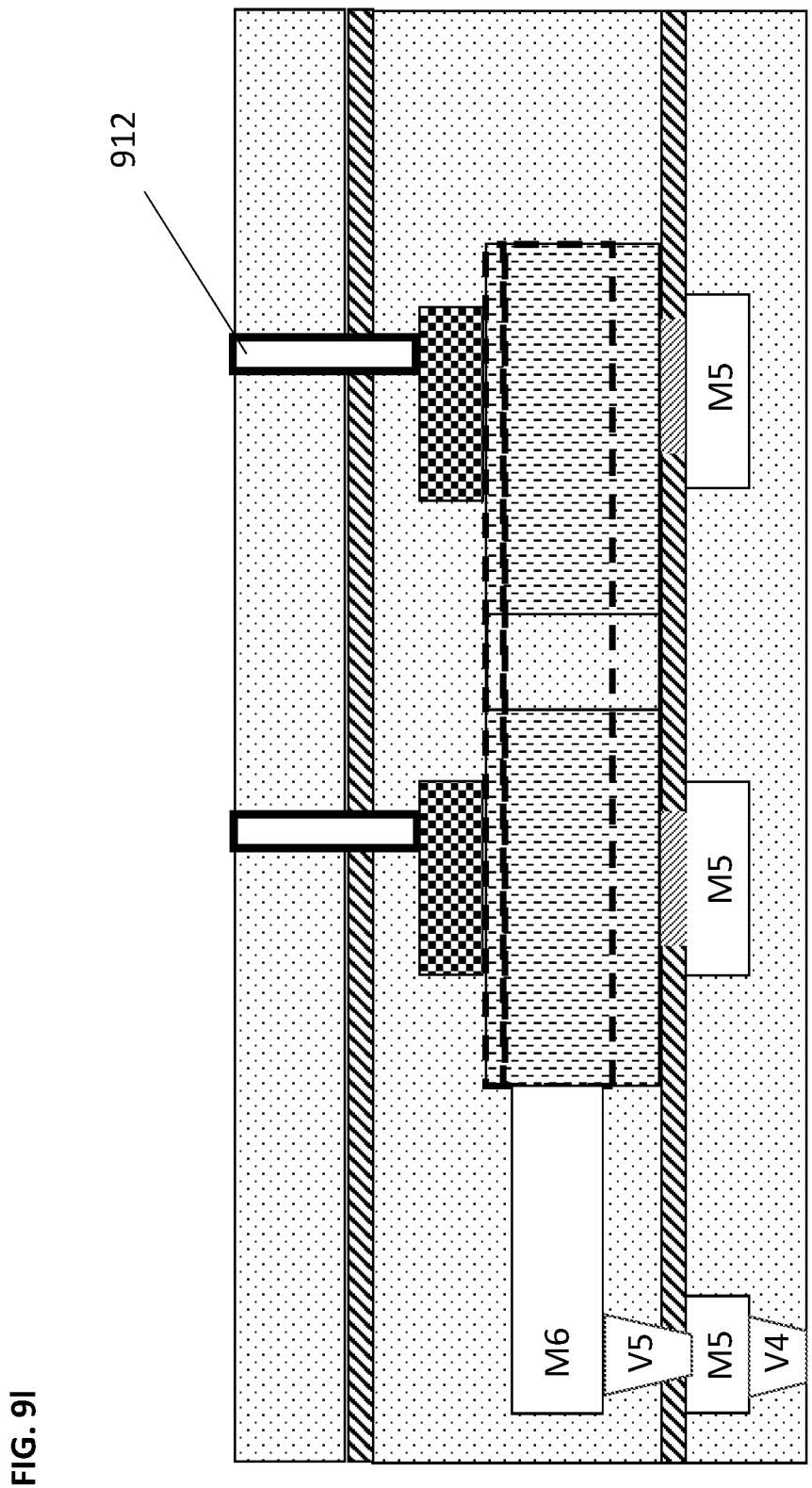
Figure 9M:
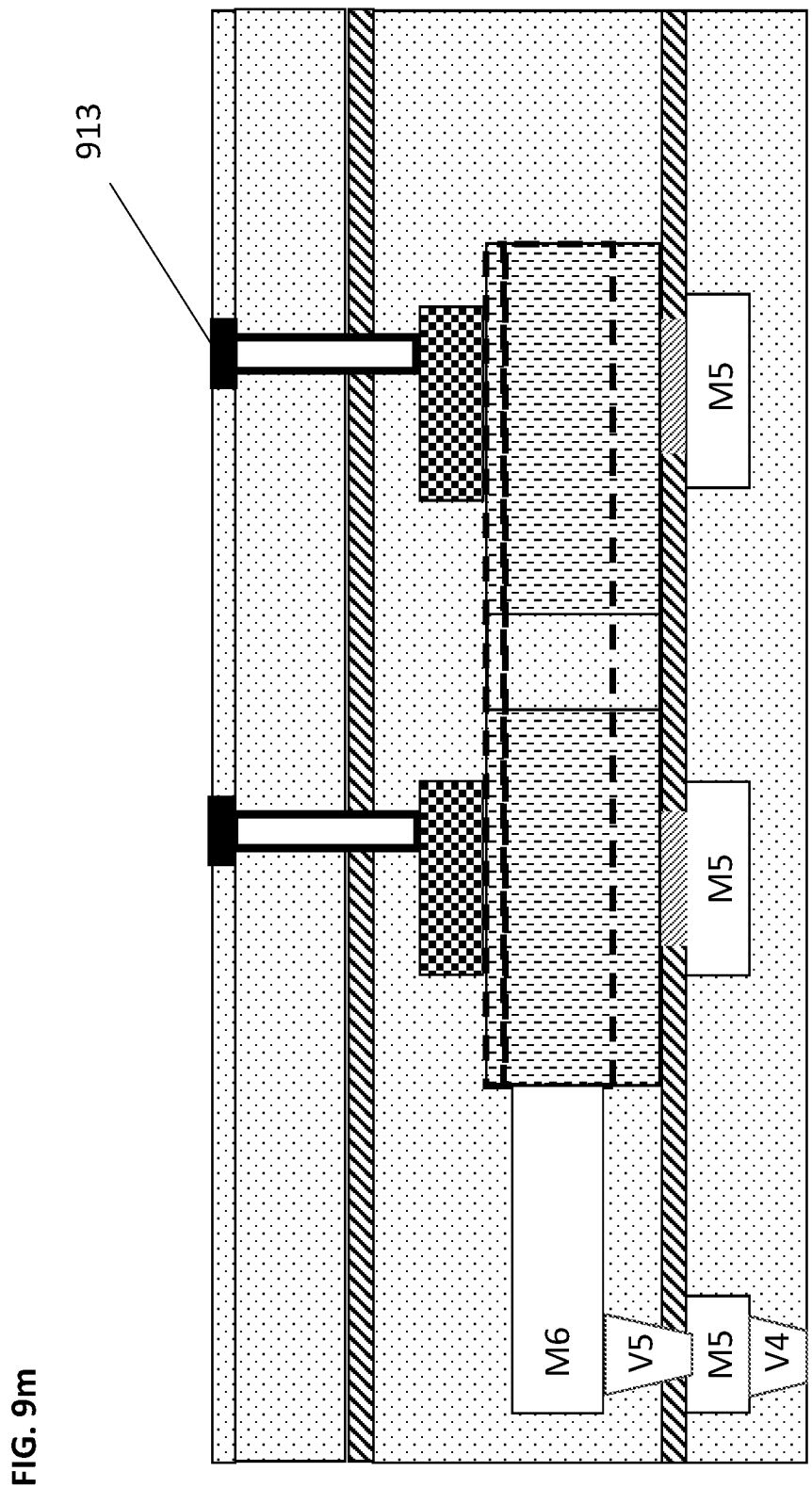
Figure 9N:
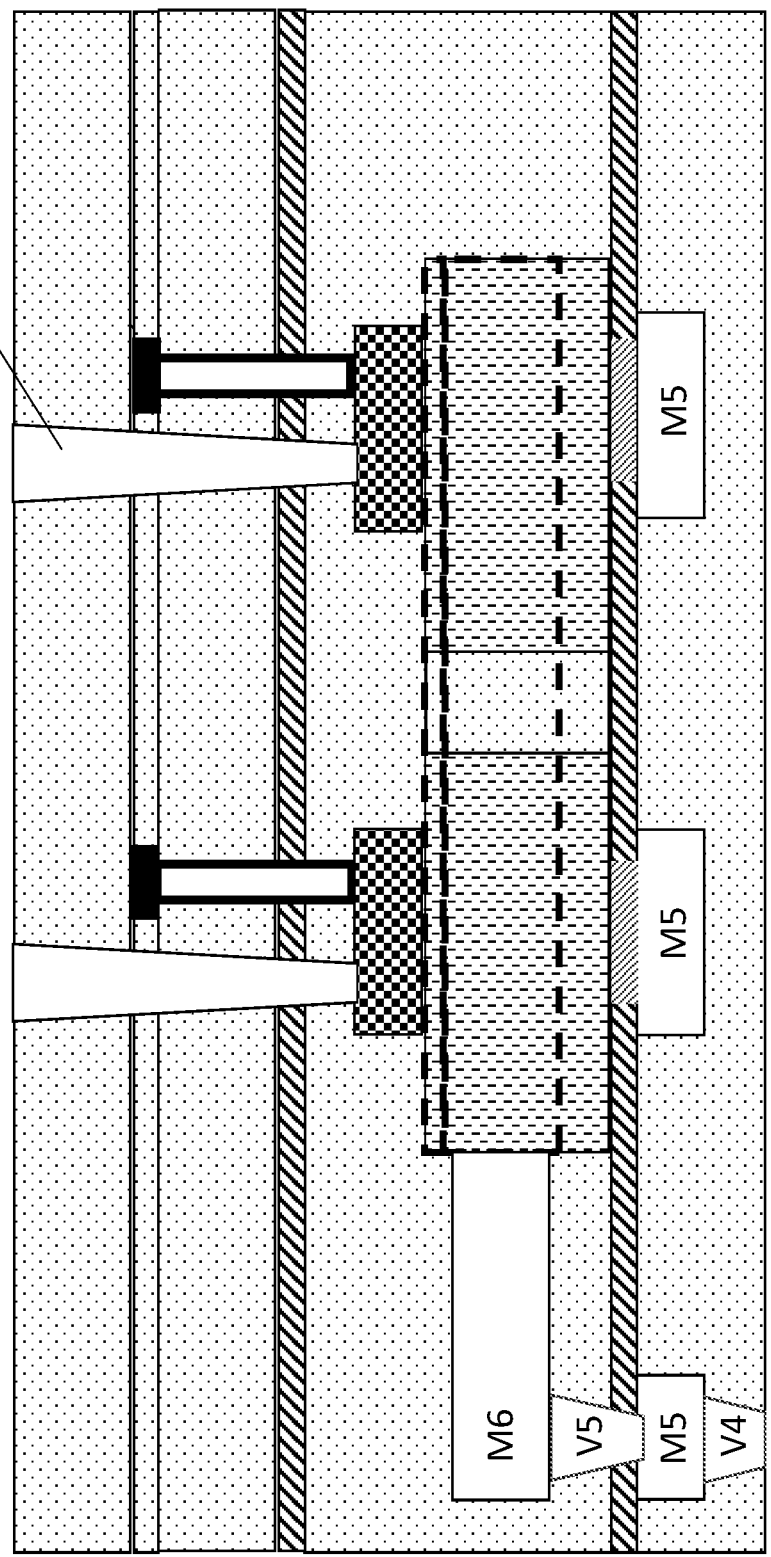
Figure 9P:
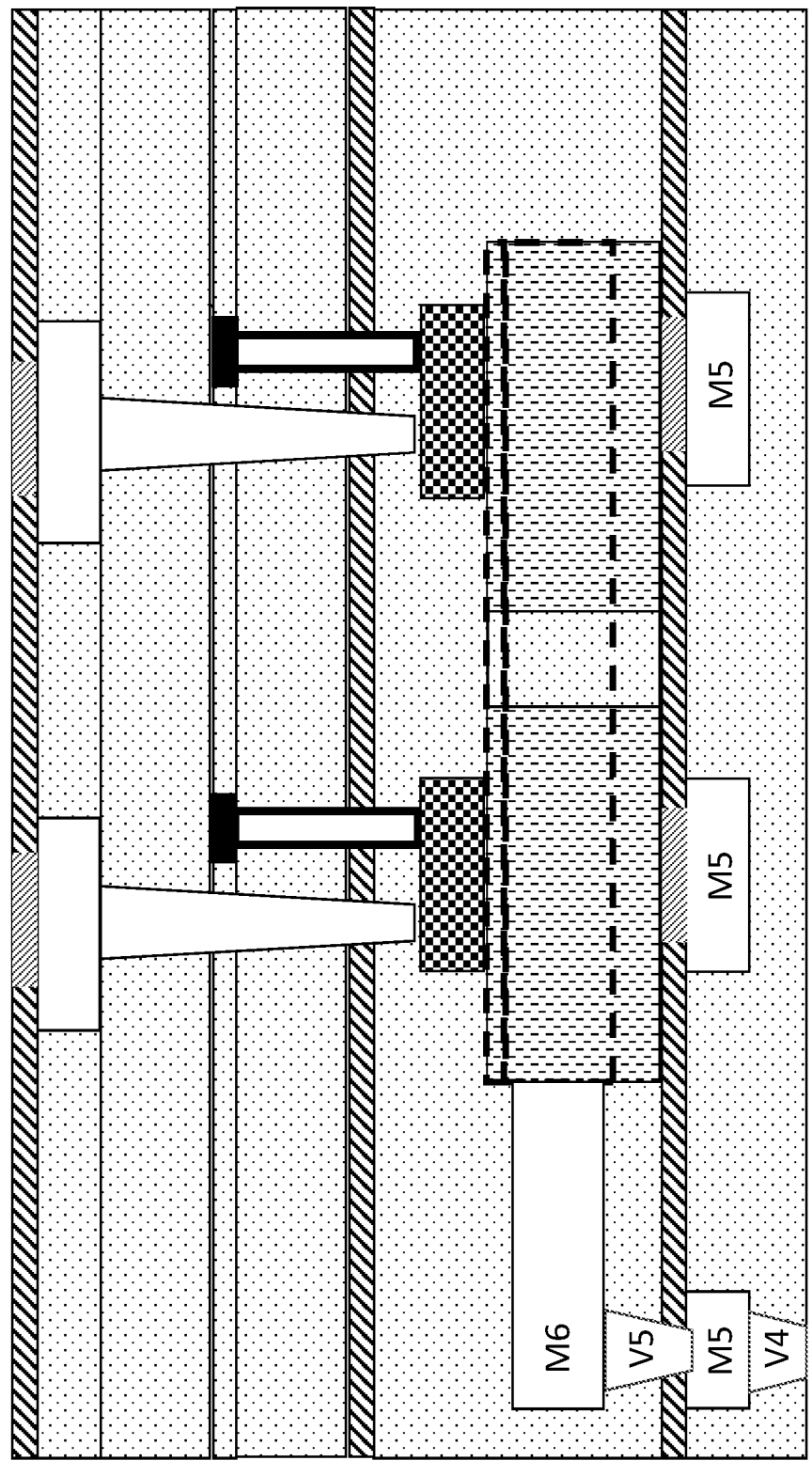
Figure 9Q:
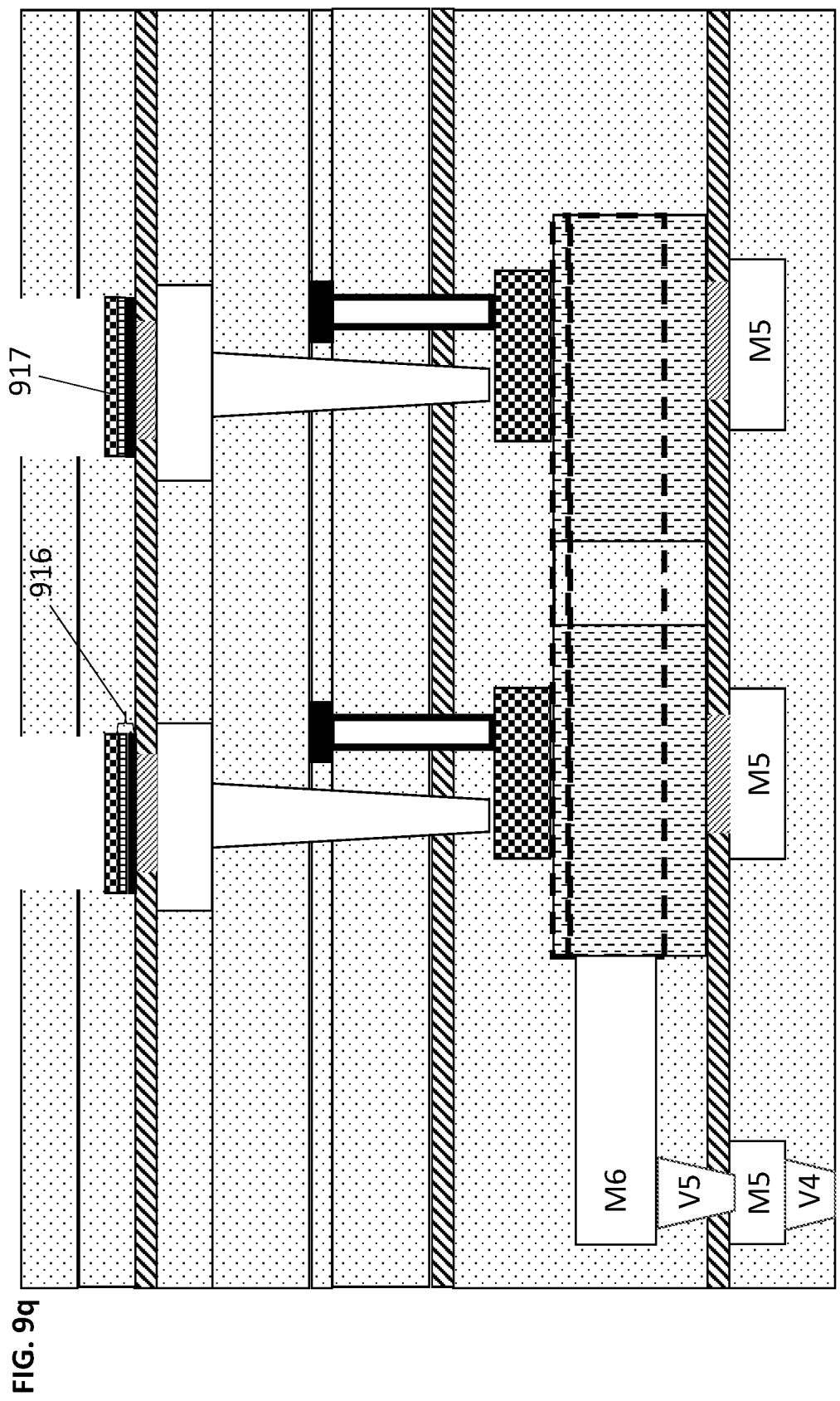
Figure 9R:
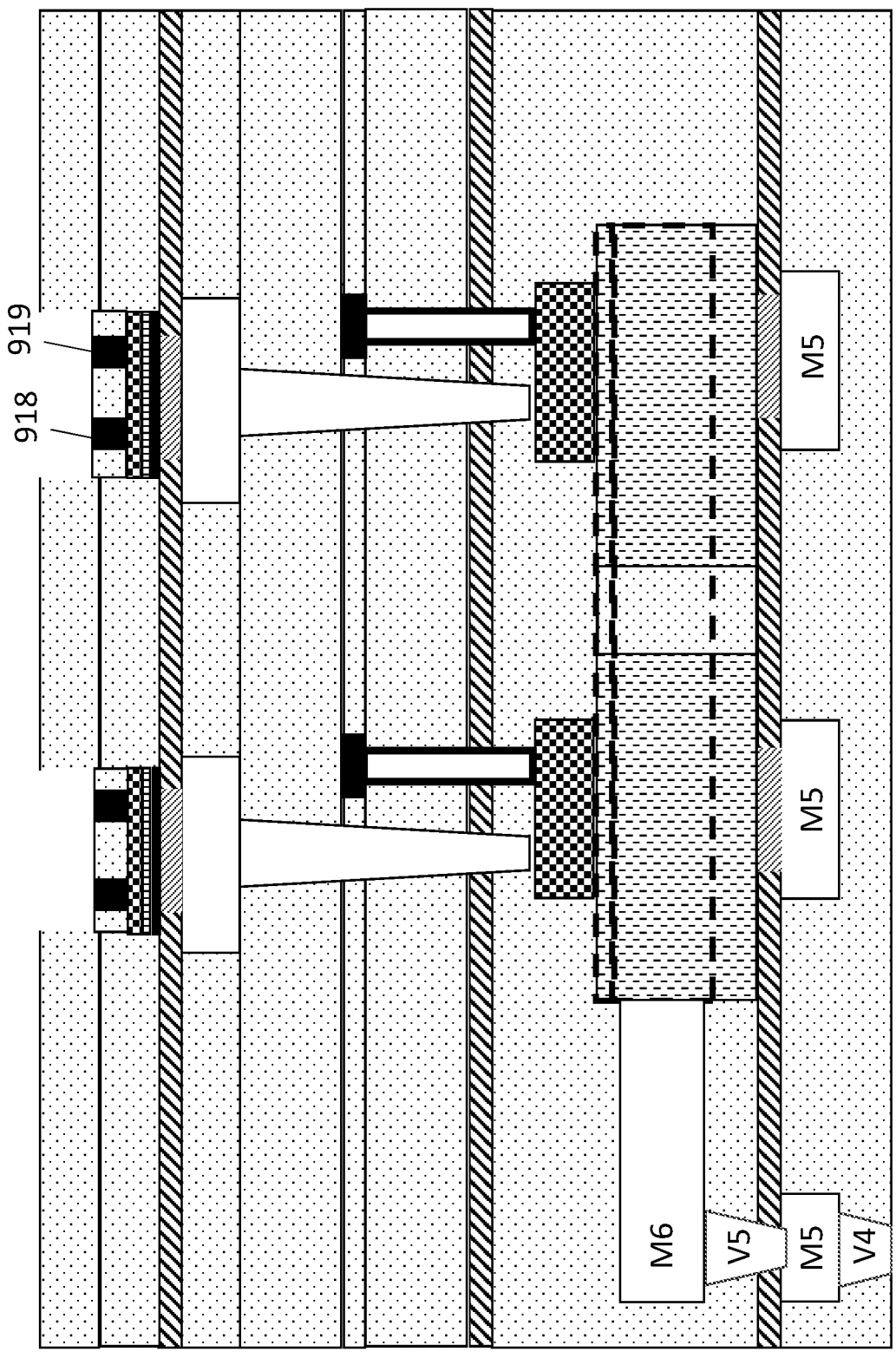
Figure 9S:
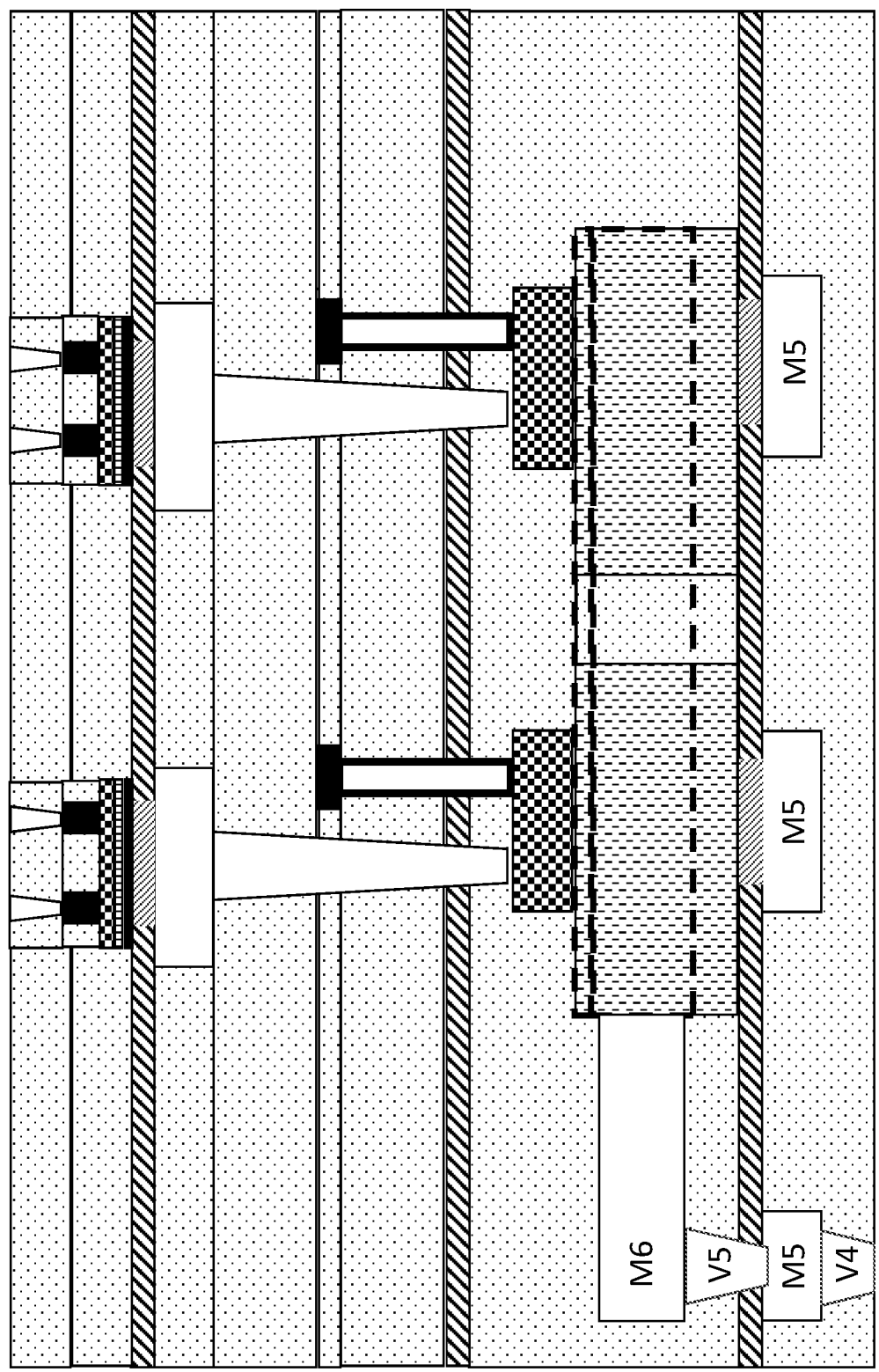

FIGS. 9a through 9s depict a process for manufacturing the BEOL 2T1C eDRAM cell of FIGS. 8a and 8b. As observed in FIG. 9a, the process begins just after completion of the M5/V4 metal layers have been formed. FIG. 9b shows the structure after the M5/V4 dielectric 901 has been covered with an etch stop layer 902 (e.g., composed of silicon nitride (e.g., SiN) or aluminum (Al)). It should be understood that the process can begin at any metal layer and initiation of the process after completion of the M5/V4 layers is only exemplary.

As observed in FIG. 9c, the etch stop layer 902 is patterned and etched and the metal source/drain 904 for the lower TFT is formed in the exposed openings. In various embodiments the source/drain 904 is composed of tantalum nitride (e.g., TaN) and/or titanium nitride (e.g., TiN), etc. As observed in FIG. 9d, the lower TFT channel material 905 is deposited. The channel material may be poly-silicon, poly-germanium or a polycrystalline composition of III-V elements that is doped n type or p type depending on desired transistor type for the lower TFT. Various metal oxides having some conductivity can also be used for the TFT channel material.

As observed in FIG. 9e, the gate oxide or other dielectric (e.g., see feature 806 of FIG. 8b) and gate node 907 (see also feature 807 of FIG. 8b) are formed in the channel material 905. First, the channel material is etched to form a trench along the x axis into which the gate oxide is deposited. The gate dielectric can be composed of any of hafnium oxide, zirconium oxide, aluminum oxide, $SiO_2$, etc. Then, a similar trench is formed in the gate oxide and, e.g., a metal or highly conductive poly-silicon gate 807/907 is deposited therein. As observed in FIG. 9f a passivation layer 908 is formed over the gate node and the exposed gate oxide (see also, feature 808 of FIG. 8b).

As observed in FIG. 9g, the channel and gate structures of both transistors are etched in a region between them and the exposed opening is filled with dielectric to isolate the channels of the bottom transistors. As observed in FIG. 9h, drain/source features 910 are respectively formed on the channels. The drain/source may be formed, e.g., of tungsten (W). As observed in FIG. 9i the remaining structure is covered with dielectric 903 to effectively complete formation of the lower TFT.

As observed in FIG. 9j, the V4 and M5 metal structures are formed, e.g., by way of a dual damascene process. The observed M5 metal bar 911 makes contact to the gate nodes 807/907 of the transistors. As observed in 9k, an etch stop layer that marks completion of the M5/V4 layers is deposited and then a layer of dielectric is formed on the etch stop layer.

As observed in 9l, the capacitor structures 912 are formed, e.g., according to a standard metal-insulator-metal process. That is, first the dielectric is etched to form holes for the structure. Then, a thin film or thin multilayer structure is formed in the hole including along the sidewalls to form a bottom electrode. Then, dielectric material is deposited in the remaining void. The structure is then capped with a top metal electrode. The wiring that connects to the top electrode (e.g., the PCT wire node of FIGS. 7a-7d) is then formed on the top electrode as observed in FIG. 9m.

As observed in FIG. 9n, another layer of dielectric is deposited, etched and filed with metal to form source/drain contacts 914 of the lower TFT. The contact formation may be formed with a separate process than by which nominal V5 vias are formed. The contacts are then capped with M6 wire structures as observed in FIG. 9o.

As observed in 9p, an etch stop layer that marks completion of the M6/V5 layers is deposited, etched and filled with metal or other conductive material (e.g., degenerately doped poly-silicon) to form a short via to the upper TFT. As observed in FIG. 9q, dielectric layering is deposited, etched to form voids into which are deposited the gate structure 916 (which includes a lower gate electrode and an upper gate dielectric) and the channel material 917 for the upper TFT. As observed in FIG. 9r, a dielectric layer is deposited on the channel material 917, etched and source/drain nodes 918/918 are formed in the voids on the exposed channel material 917 (e.g. with polysilicon that is doped for the particular type of transistor). The remaining void is filed with dielectric which is etched and source/drain contacts 918/919 formed in the exposed openings therein as observed in FIG. 9s.

Generally, the deposition processes described above can be performed with atomic layer deposition, plasma deposition or chemical vapor deposition. Likewise, etch processes can be performed with plasma or chemical etches.

3.0 Integrated BEOL Capacitor and TFT for Switched Capacitor Computation

FIG. 10 depicts a high level view of a switched capacitor charge sharing circuit 1003 within a mathematical function circuit 1002. The mathematical function circuit 1003 may be a component within a CIM circuit such as any of the CIM circuits of FIGS. 3a, 3b and 4. The charge sharing circuit 1003, and/or other charge sharing circuits like it, may be used to perform an accumulation in a multiply accumulate operation.

According to the operation of the charge sharing circuit 1003, observed at inset 1004, initially at time T0 the capacitors C1 through CN are charged to respective voltage/charge levels from the memory array 1001. Subsequently, at time T1, the respective charges of first and second capacitors (C1 and C2) are shared with the closing of a first switch between them while all other switches remain open. Here, for instance, with each of the capacitors designed to have approximately equal capacitance, and assuming for simplicity the capacitors are only stored with binary levels (a 1 or a 0) during the initial charge phase, the voltage on both the first and second capacitors will be: i) a 0 if both capacitors are storing a 0; ii) a 1 if both capacitors are storing a 1 ($2Q=2CV \Rightarrow V=Q/C$); and, iii) a 0.5 if one of the capacitors is storing a 0 and the other capacitor is storing a 1 ($Q=2CV \Rightarrow V=Q/2C$).

At time T2, a second switch is closed and all other switches are open to effectively share the charge of only the second and third capacitors (C2 and C3). Here, operation is similar to that described just above. However, the voltage level that results on the second and third capacitors is affected by the "history" of the first and second capacitors' initially stored values.

For example, if the resultant voltage on C1 and C2 after time T1 is 0.5 (reflecting one of C1 and C2 was initially charged with a 0 and the other of C1 and C2 was initially charged with a 1), the resultant voltage at time T2 on capacitors C2 and C3 will be a 0.75 if C3 is storing a 1 ($1.5Q=2CV \Rightarrow V=3Q/4C$), or, a 0.25 if C3 is storing a 0 ($0.5Q=2CV \Rightarrow V=Q/4C$).

Notably, after the charge sharing at time T2, if the combined charge across all three capacitors C1, C2, C3 were shared again across all three capacitors, the resultant voltage would perfectly reflect their accumulated charge. For example, if one of C1 and C2 was initially stored with a 1 and the other was initially stored with a 0, if the third capacitor was initially stored with a 1 the resultant voltage would be 0.66 ((0.5+0.75+0.75)/3=⅔), or, if the third capacitor was initially stored with a 0, the resultant voltage would be a 0.33 ((0.5+0.25+0.25)/3=⅓). Thus, the resultant voltage across all capacitors whose charges have been shared in pairs through the switching activity will reflect an accumulation of the charges that the capacitors were initially charged with.

As observed in inset 1004, the remaining capacitors are sequentially shared in neighboring pairs as described above over subsequent times until the last capacitor CN participates in the paired charge sharing process at time T(N−1). Subsequently, at time TD, the charges across all N capacitors are simultaneously shared on a common inference 1005 node by simultaneously shorting a set of "dump" switches (where each dump switch couples a particular capacitor to the common inference node). The resultant voltage on the inference node 1005 will reflect the accumulated charge of the capacitors' initially charge values. After a sense of the inference node 1005, the capacitors are cleared of their charges and the process repeats.

Although the above description was directed to an implementation where the initially stored values where binary, the circuit will also provide an accurate representation of the accumulated charge if the initially stored values include more than two discrete charge/voltage levels or even a linear (continuous) range of charge/voltage levels.

As observed in FIG. 10 the charge sharing circuit 1003 includes separate inputs that are coupled to a CIM circuit memory array 1001. A wide variety of computational approaches can be realized, e.g., depending on the precise configuration of the charge sharing circuit within the mathematical function circuit of FIG. 10 and/or the manner in which it is coupled to the memory array.

According to a first possible approach, the separate inputs of the charge sharing circuit 1003 are respectively coupled to the read data lines of different columns of the CIM circuit memory array 1001 (each read data line, in turn, may be simultaneously driven by more than one activated memory cell). Here, for instance, the data stored by more than one memory array column may be needed to fully calculate the input stimulus for a particular neuron and the charge sharing circuit 1003 is tasked with accumulating the respective charge values that are presented on the read data lines across the different columns.

According to a second possible approach, connection values for a particular neuron's input stimulus are stored row-wise across the memory array. A row-wise read operation is performed which presents a full word of connection values to a mask circuit 1006 within the mathematical function circuit 1002. A vector of binary weight elements is then applied by the mask circuit 1006 against the input word to pass through only those connection values having a corresponding weight of 1 to the charge sharing circuit's storage capacitors. In this case, the charge sharing circuit's storage capacitors collectively store (on a vector element by vector element basis) the resultant of a multiply operation (i.e., the masking circuit 1006 effectively performs the multiply operation). The charge sharing circuit 1003 then accumulates the charge across the capacitors to effectively perform the accumulate operation.

Thus, in the first approach, the multiply step may be effectively performed by the memory array (e.g., by selective row activation) and the mathematical function circuit 1003 only performs the accumulation step. By contrast, in the second approach, both the multiply and accumulation steps are performed by the mathematical function circuit 1003.

According to yet another (third) possible approach, which does not use the mask circuit 1006, the inputs of the charge sharing circuit 1003 are respectively coupled to the individual storage cells of a same column within the memory array 1002 (in which case the horizontal axis of the memory array of FIG. 10 runs parallel to the memory array's columns). Here, the inference node 1005 effectively corresponds to a common read data line and the charge sharing circuit 1003 is responsible for sensing the combined charge from multiple activated storage cells along a same memory array column.

A wealth of other possible applications/configurations of the charge sharing circuit 1003 in relation to the memory array 1001 and the precise math function(s) to be performed also exist.

A scaling problem may arise if the number of capacitors in the charge sharing circuit 1003 is strongly linear with the number of storage cells in the memory array 1001. For example, in the second approach described above, the number of storage capacitors in the charge sharing circuit may be equal to the number of storage cells per memory row multiplied by the number of memory rows that can be simultaneously accessed. Thus, if the memory array 1001 is designed so that all its rows can be simultaneously accessed, there will be as many capacitors in the charge sharing circuit 1003 as there are storage cells in the memory array 1001.

Additionally, as depicted in FIG. 10, the charge sharing circuit 1003 includes two switches per capacitor. The aforementioned mask circuit 1006 of the second approach, if also included, adds an additional switch per capacitor. Generally, a separate transistor is needed to implement each switch. As such, the aforementioned second approach may not only introduce a large number of capacitors to mathematical function circuit 1002 but also three times more transistors to the mathematical function circuit 1003.

In short, the more complex the charge sharing circuit 1003 and any associated circuitry (such as the mask circuit 1006) becomes, the more capacitors and transistors are to be integrated into the mathematical function circuit 1002. If too much complexity is attempted, the size of the mathematical function circuit 1002 (e.g., from a surface area consumption perspective) may become too large to be viable. As such, only scaled down mathematical function circuitry may be considered as options (e.g., a mathematical function circuit that performs accumulation but not multiply-accumulation).

Figure 11:
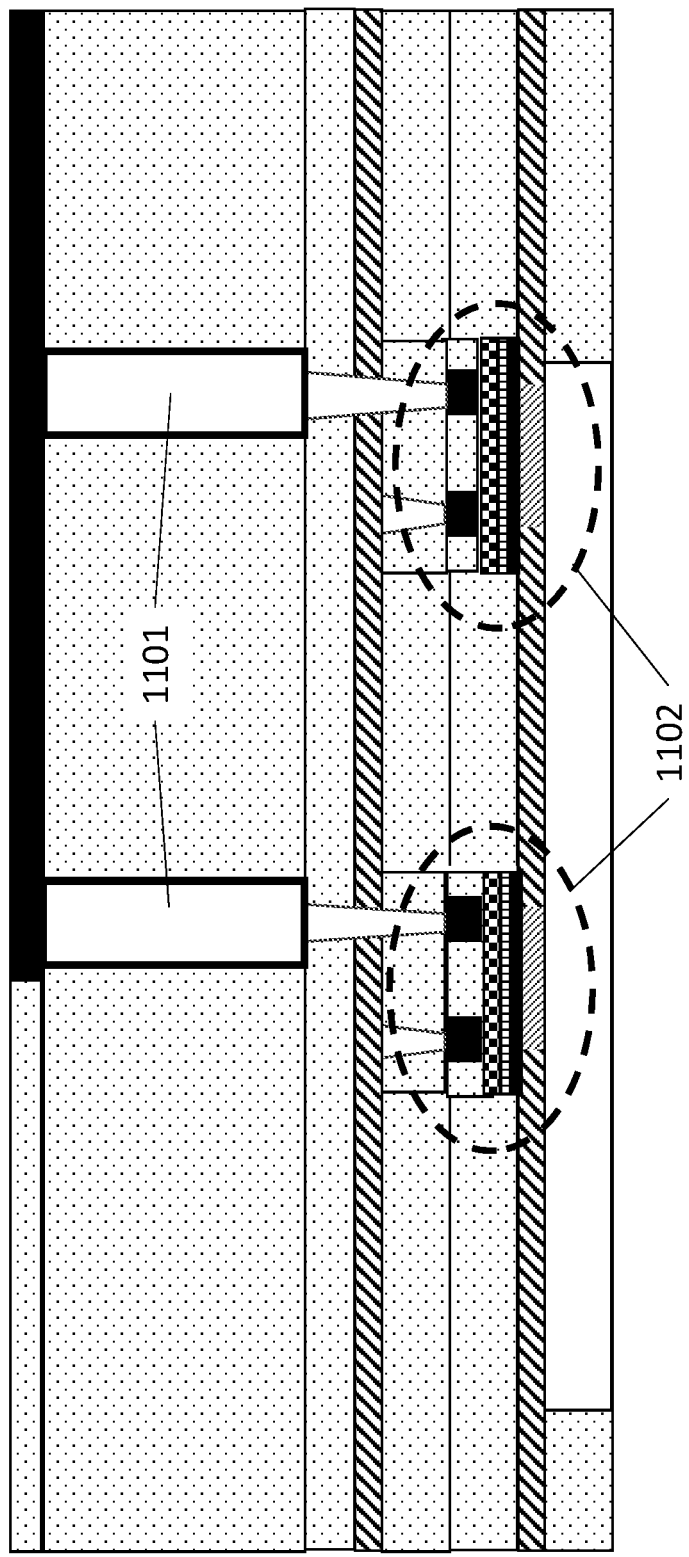
FIG. 11 shows an integrated BEOL capacitor and TFT transistor for use in a switched capacitor accumulation circuit.

A solution, as depicted in FIG. 11, is to implement the capacitors of the charge sharing circuit with BEOL capacitors 1101 that are integrated, e.g., above the storage cells of the memory array in the metal/dielectric layering above the semiconductor substrate. For example, if the memory array is implemented with 6T, 8T or 10T SRAM cells, the storage cells of the memory array 1001 are implemented with transistors that are embedded in the semiconductor substrate. Even if there is one charge sharing circuit capacitor per memory array storage cell, conceivably, the capacitor may be located above the storage cell amongst the interconnect metallurgy resulting in no extra expenditure of overall surface area.

Additionally, recalling that each capacitor of the shared charge circuit 1003 may have, e.g., two or three associated transistors, the solution of FIG. 11 additionally addresses any scaling issues associated with shared charge circuit complexity by implementing at least one such associated transistor as a thin film transistor 1102 that is embedded amongst the interconnect metallurgy along with its capacitor. As such, both a capacitor 1101 of the shared charge circuit 1003 and at least one of its transistors are integrated above the semiconductor substrate resulting in an efficient layout of the charge sharing circuit.

Here, the capacitor 1101 and associated thin film transistor(s) 1102 may be located above the memory array or above other transistors of the charge sharing circuit 1003, masking circuit 1006 (if present) or larger mathematical function circuit 1003 resulting in reduced footprint size and corresponding improved scalability of the mathematical function circuit 1002. As a consequence, more complex mathematical circuit functionality, such as a mathematical function circuit that performs not only the accumulation step but also the multiply step can be realized.

FIGS. 12a through 12i show a process for manufacturing the integrated BEOL capacitor and TFT transistor structure of FIG. 11. As observed in FIG. 12a, the process begins just after completion of the M7/V6 metal layers have been formed and the M7/V6 dielectric has been covered with an etch stop layer. It should be understood that the process can begin at any metal layer and initiation of the process after completion of the M7/V6 layers is only exemplary.

Figure 12A:
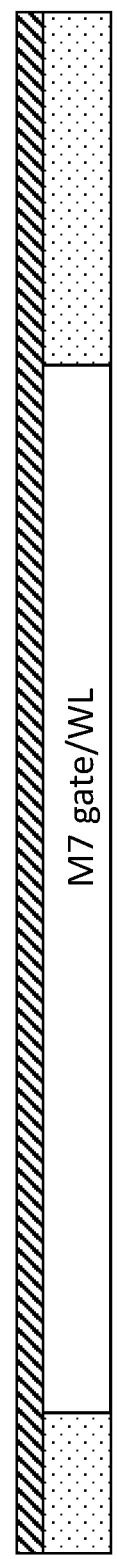
FIGS. 12a, 12b, 12c, 12d, 12e, 12f, 12g, 12h and 12i show a process for manufacturing the structure of FIG. 11.
Figure 12B:
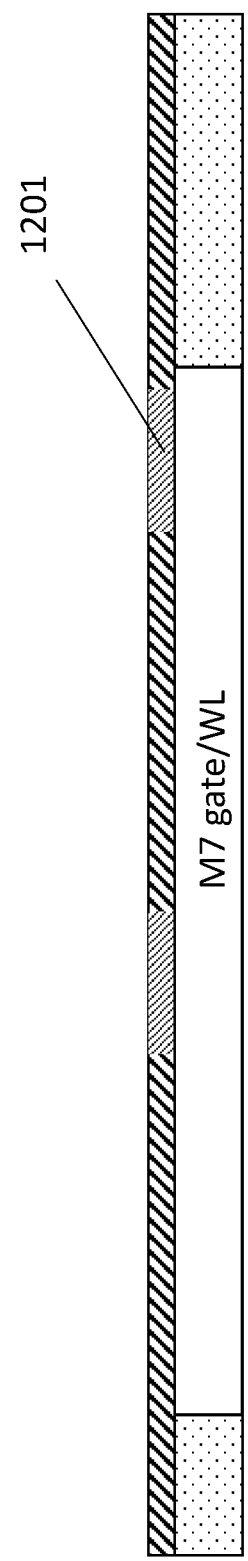
Figure 12C:
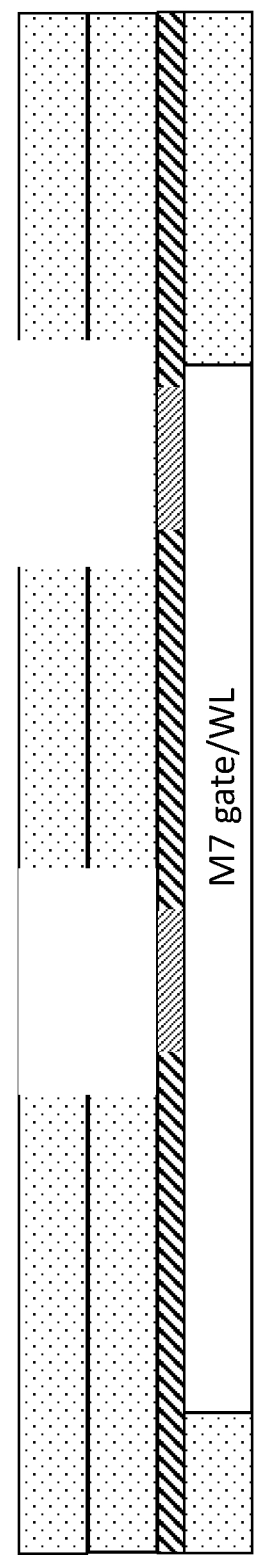

As observed in FIG. 12b the etch stop layer is patterned and etched and a short via 1201 to the TFT is formed in the exposed openings. In various embodiments the via 1201 is a metal, metal alloy, etc. As observed in FIG. 12c, layer(s) of dielectric are formed over the structure and etched to expose openings for the TFT transistor.

Figure 12D:
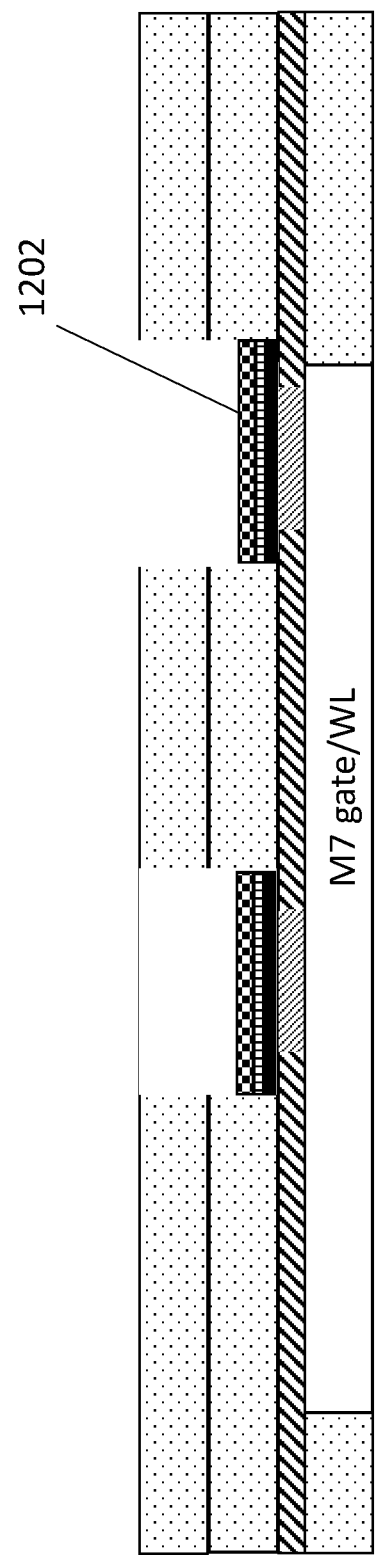
Figure 12E:
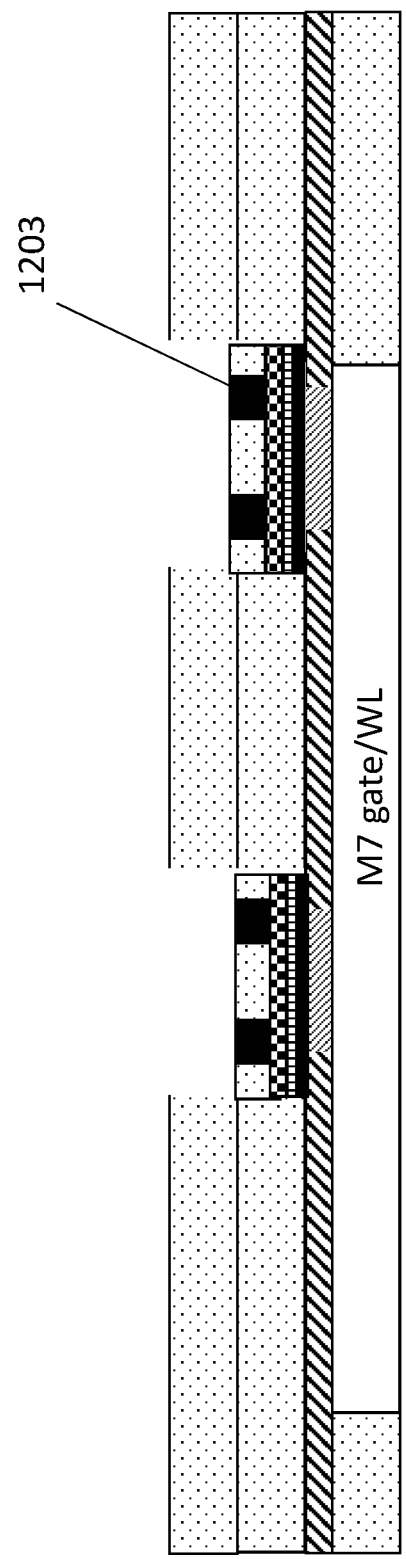
Figure 12F:
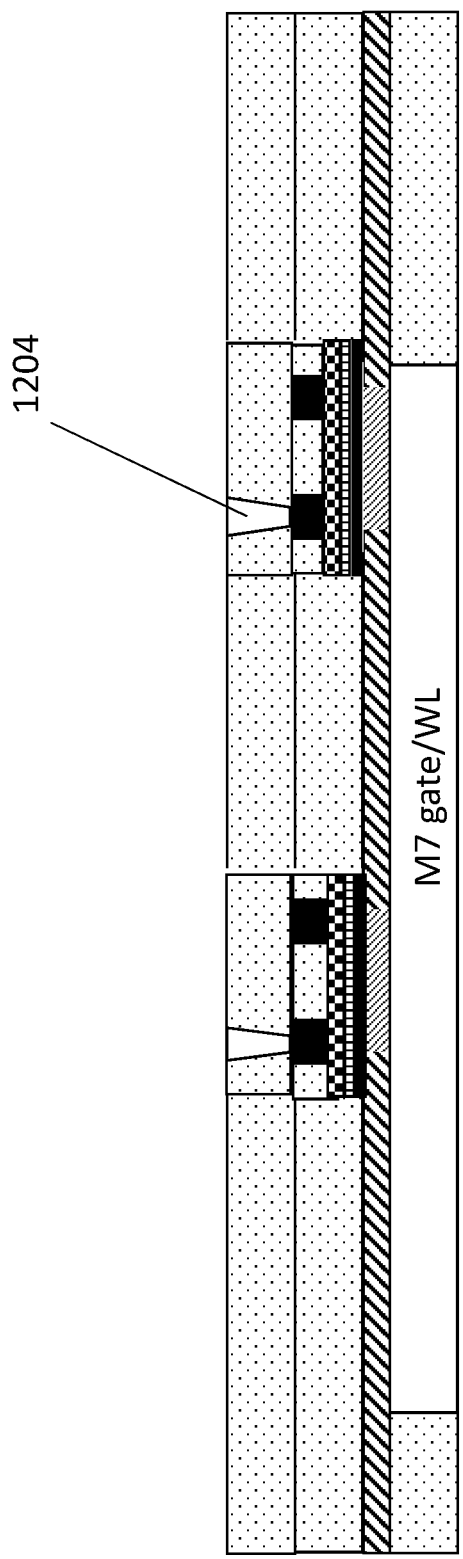

As observed in FIG. 12d, the gate structure (lower gate node and upper gate dielectric) and channel material 1202 for the TFT are deposited in sequence in the exposed void. The gate electrode can be composed of degenerative doped poly-silicon and/or a metal. The gate dielectric can be composed of any of hafnium oxide, zirconium oxide, aluminum oxide, $SiO_2$, etc. The channel material may be poly-silicon, poly-germanium or a polycrystalline composition of III-V elements that is doped n type or p type depending on desired transistor type for the lower TFT. As observed in FIG. 12e, a dielectric layer is deposited on the channel material 1202, etched and source/drain nodes 1203 are formed in the voids on the exposed channel material 1202 (e.g. with polysilicon that is doped for the particular type of transistor). The remaining void is filed with dielectric which is etched and source or drain contacts 1204 formed in the exposed openings therein as observed in FIG. 12f.

Figure 12G:
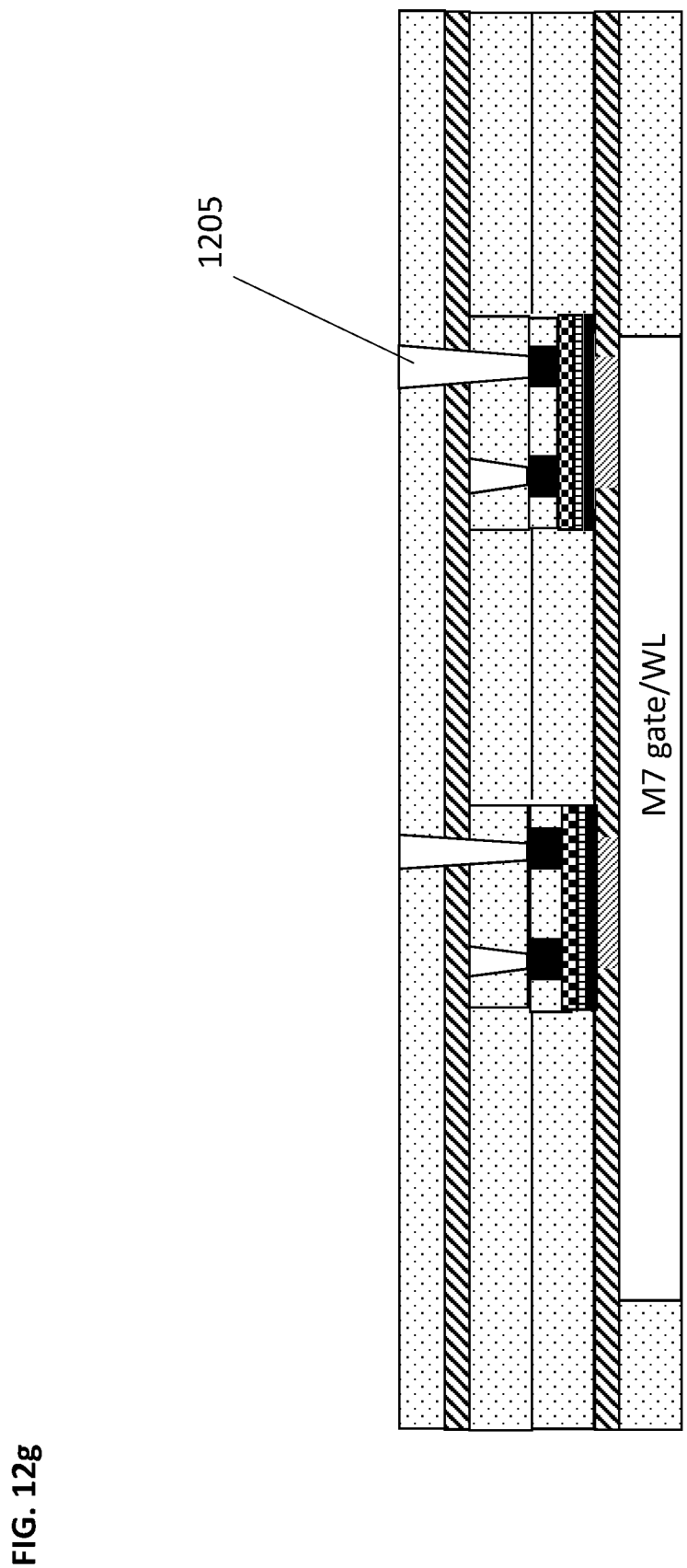
Figure 12H:
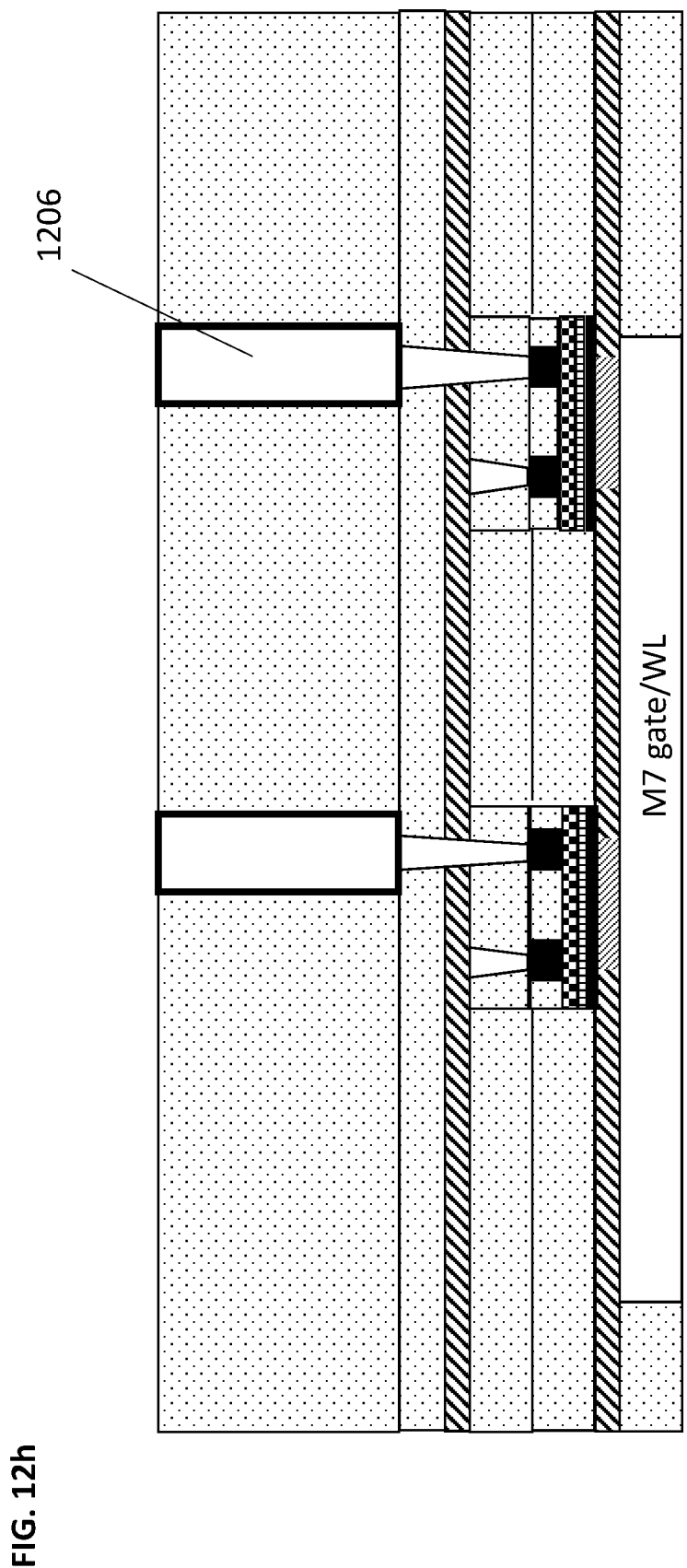
Figure 12I:
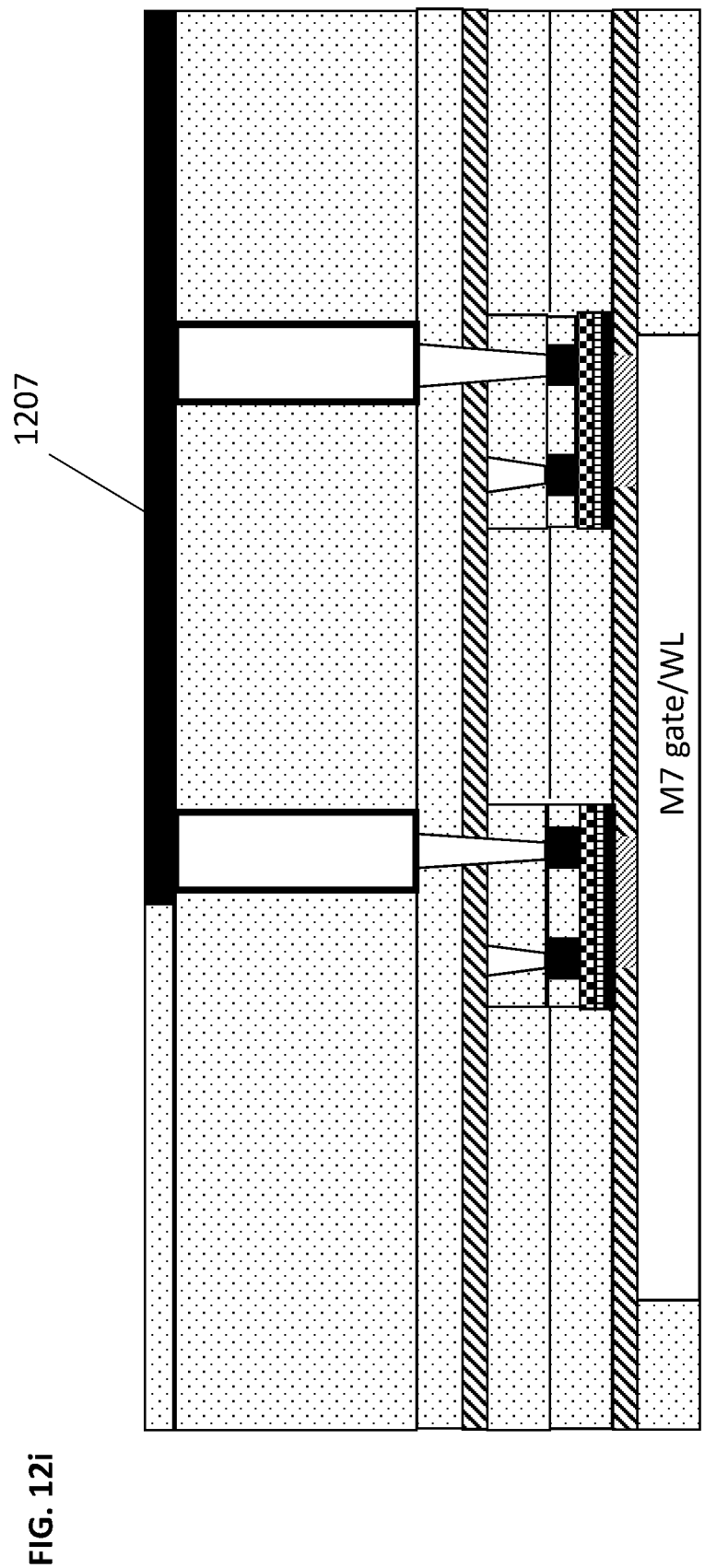

An etch stop layer that marks the completion of the M7/V6 layers is then deposited upon which is deposited dielectric which is etched to form drain or source contacts 1205 as observed in FIG. 12g. As observed in FIG. 12h, more dielectric is deposited and etched to form voids for the capacitors 1206. The capacitors 1206 are then formed in the voids according, e.g., to a standard MIM capacitor structure process. As observed in FIG. 12i, wires that form, e.g., the wiring that is coupled to one of the capacitor nodes (the other being coupled to the TFT through via 1205) are formed.

4.0 Ferroelectric BEOL Capacitor for Reduced Footprint Accumulation Circuit

As discussed in the preceding section, as the complexity of the mathematical function circuit expands, the challenge of scaling the mathematical function circuit, e.g., with increasing memory array density and/or accessibility, also expands. In the case of a mathematical function circuit that includes capacitors for storing information sensed on read data lines (such as the charge sharing circuit 1003 discussed above in the preceding section), scaling is more easily achieved if the capacitors are composed of higher relative permittivity dielectric material.

Here, the information that the capacitor stores corresponds to the amount of charge that is kept by the capacitor in response to a particular read data line voltage. With higher relative permittivity dielectric material, a capacitor can generate more charge per unit of voltage. As such, smaller capacitors can be physically constructed that nevertheless keep sufficient amounts of charge to sufficiently infer the read data line voltage. Said another way, capacitors of sufficiently high capacitance can be constructed that consume only small amounts of physical space. The integration of smaller yet suitably operable capacitors into the mathematical function circuit, e.g. into a switched capacitor circuit like the accumulation circuit 1003 of FIG. 10, helps to address the aforementioned scaling challenge.

Generally, there is overlap between higher relative permittivity dielectrics and dielectrics that exhibit ferroelectric behavior. FIG. 13 qualitatively compares an exemplary hysteresis curve 1301 of a ferroelectric, higher relative permittivity dielectric that is suitable for smaller physical capacitors as described above against the hysteresis curve 1302 of a lower permittivity dielectric that is typical/common of capacitors manufactured with semiconductor manufacturing processes. As observed in FIG. 13, the electric dipole moment (D) of the ferroelectric dielectric 1301 is significantly more responsive to an applied electric field (E) than the common dielectric and reaches a higher saturation dipole moment ($D_s$).

Ideally, in order to accurately record the information presented on the read data line, as observed in FIG. 13, the shape of the hysteresis curve 1301 is substantially linear as opposed to exhibiting a "staircase" structure of increasing D with increasing E. Staircase structures are generally the result of polycrystalline dielectrics having larger grain sizes, e.g., greater than 3 nm. With each "flip" in direction of a large grain's electrostatic dipole moment in response to an applied electric field the dielectric's overall dipole moment in the applied field direction "jumps" in a noticeably discrete fashion.

By contrast, if the dielectric material is composed of smaller grains (e.g., up to 3 nm) and/or is partially or wholly amorphous such jumps are hardly discernable or non-existent and the dipole moment ramp is substantially smooth with applied field. In various embodiments, the smaller grained and/or amorphous ferroelectric material is a composition of hafnium zirconium oxide (e.g., $Hf_xZr_{1-x}O_2$), hafnium oxide (e.g., $HfO_2$) or zirconium oxide (e.g., $ZrO_2$) that has approximately 0.1 to 5% of yttrium (Y) dopant. The yttrium dopant effectively induces the smaller grained and/or amorphous microstructure of the overall composition. In further embodiments, e.g., the material has a cubic orthorhombic hetero phase micro structure. In still other embodiments the ferroelectric material may be composed of any of hafnium aluminum oxide (e.g., $HfAlO_x$), hafnium silicon oxide (e.g., $HfSiO_x$), hafnium zirconium aluminum oxide (e.g., $HfZrAlO_x$), hafnium zirconium silicon oxide (e.g., $HfZrSiO_x$), hafnium yttrium oxide (e.g., $HfYO_x$), yttrium zirconium oxide (e.g., $YZrO_x$), hafnium yttrium zirconium oxide (e.g., $HfYZrO_x$), etc.

The BEOL capacitor can be formed according to various BEOL capacitor manufacturing processes such as a metal-insulator-metal manufacturing process. Here, a via is etched in dielectric. A thin film of metal is then formed in the via hole to form a lower electrode. The remaining cavity of the via hole is then filled with the ferroelectric material. A metal cap layer is then formed over the structure to form an upper electrode. The BEOL capacitor may be formed over the CIM circuit memory array which, in at least one embodiment, is an SRAM memory array. The bottom or top metal electrodes can be composed of an of titanium nitride (e.g., TiN), tantalum nitride (e.g., TiN), tungsten (W), tantalum (Ta), titanium (Ti), aluminum (Al), titanium aluminum carbon (e.g., TiAlC), nickel silicon (e.g., NiSi), polysilicon doped to be conductive, tungsten nitride (e.g., WN), molybdenum (e.g., Mo), ruthenium (e.g., Ru), hafnium (e.g., Hf) including alloys thereof. Layered electrodes are also possible (e.g., Ta/TaAlC/TaN or Ta/TaAlC/Ti/TiN as just two examples). The total thickness of these electrodes can be anywhere between 1 nm to 50 nm. Method of deposition can be atomic layer deposition (ALD), chemical vapor deposition (CVD) or plasma vapor deposition (PVD). The thickness of the ferroelectric can be, e.g., anywhere between 1 nm to 40 nm.

FIG. 14 shows a hysteresis curve 1401 for another embodiment where, e.g., the grain and/or molecular dipole moment switching is so uniform (e.g., all grains flip at nearly a same applied field) that the capacitor behaves like a binary capacitive switching device. That is, for example, if the capacitor is initially erased to a first dipole moment direction ($-D_S$), the capacitor will retain its erased state unless and until the read line voltage corresponds to an electric field that surpasses the material's coercivity ($E_c$). If so, the dipole moment of the capacitor switches to its other, second saturation dipole moment ($+D_s$).

FIG. 15 shows a switched capacitor accumulation circuit 1500 that uses such a binary capacitor to perform an accumulation step. As such, the circuit 1500 of FIG. 15 may be used instead of the charge sharing circuit 1003 of FIG. 10. Like the charge sharing circuit 1003 of FIG. 10, the accumulation circuit 1500 of FIG. 15 has multiple inputs from the memory array 15001 that are each coupled to a respective capacitor. Initially at time T0, the capacitors are erased to a first state. During time T1 the capacitors each receive a respective voltage from, e.g., a respective read data line or storage cell within the memory array (an optional mask circuit 1506 for performing a preceding multiplication step may or may not be included).

Those of the capacitors that observe a voltage sufficient to surpass its coercivity flip to their second state. A current sensing circuit, such as current mirror circuit 1507 coupled between the back-end of the capacitors and their reference (e.g., ground) node monitors the current that results from the switching activity of the capacitors that flip. Here, assuming the capacitors are sufficiently similar in behavior, they should each approximately switch at the same time to an approximately same input voltage. As such, if all N of the capacitors simultaneously switch, the current sensing circuit 1507 will observe a maximum possible switching current. If all but one capacitor switch, the current sensing circuit will observe a current that is one switch current increment (i.e., the switch current of one capacitor) less than the maximum possible switching current.

The sensed current amount is therefore akin to a thermometer code that increases by one increment with each capacitor that switches. The sensed current is therefore directly correlated to the number of capacitors that have switched and can be used to determine an accumulation of binary values across the capacitors. Notably, as compared to the charge sharing circuit 1303 of FIG. 13, the accumulation circuit 1503 of FIG. 15 eliminates the stepwise paired charge sharing switches in favor of a current sensing circuit 1507. Thus, not only can the accumulation circuit 1503 of FIG. 15 be implemented with potentially smaller surface area consumption, but also, can potentially obtain an accumulation value in far fewer clock cycles than the charge sharing circuit 1303 of FIG. 13.

With respect to the manufacture of the capacitor, the capacitor may be a via holed filled capacitor structure (e.g., similar to the capacitor structure described in the preceding sections) or may be a parallel plate capacitor structure having upper and lower metal planar electrodes with the ferroelectric material sandwiched in between. A 400°-1200° C. anneal is performed in a non-reactive ambient (e.g., argon, $N_2$) after the ferroelectric material deposition and/or after the upper electrode deposition.

5.0 CIM Circuit Applications and Closing Comments

It is pertinent to point out that the different BEOL capacitor related inventions described above can be combined in various ways. For example, a CIM circuit having an eDRAM memory array (section 2.0 above) may also include integrated BEOL and TFT transistors for switched capacitor computations (section 3.0 above) and/or include ferroelectric BEOL capacitors for reduced footprint accumulation circuitry (section 4.0 above).

In yet other embodiments, the storage cells of a CIM circuit memory array may be implemented with dynamic random access memory (DRAM) cells of, e.g., separate memory chips. Alternatively, a CIM circuit memory array may be composed of an emerging non volatile random access memory technology such as a resistive random access memory (ReRAM), ferroelectric random access memory (FeRAM), magnetic random access memory (MRAM), dielectric random access memory, phase change memory, etc. Note that emerging non volatile memories are generally capable of three dimensional storage structures in which storage cells are stacked upon one another in the metallurgy above the semiconductor die substrate. The non volatile memory cells may be integrated on the same die as, e.g., the mathematical computation circuit of the CIM circuit, and/or be present on separate die.

FIGS. 16a and 16b show different embodiments by which a CIM circuit for implementing a neural network in electronic circuitry, e.g., for artificial intelligence applications, as discussed above, may be integrated into a computing system. FIG. 16a shows a first approach in which a CIM circuit 1610 is integrated as an accelerator or co-processor to the processor's general purpose CPU processing core(s) 1601. Here, an application software program that is executing on one or more of the CPU cores 1601 may invoke an artificial intelligence function.

The invocation of the artificial intelligence function may include, e.g., an invocation command that is sent from a CPU core that is executing a thread of the application and is directed to the CIM accelerator 1610 (e.g., the invocation command may be supported by the CPU instruction set architecture (ISA)). The invocation command may also be preceded by or may be associated with the loading of configuration information into the CIM hardware 1610.

Such configuration information may, e.g., define weights of inter-nodal connections and/or define math functions to be performed by the CIM accelerator's mathematical function circuits. With respect to the later, the CIM accelerator's mathematical function circuits may be capable of performing various math functions and which specific function is to be performed needs to be specially articulated/configured for various math circuits or various sets of math circuits within the CIM accelerator 1610 (e.g., the math circuitry configuration may partially or wholly define each neuron's specific math function). The configuration information may be loaded from system main memory and/or non volatile mass storage.

The CIM hardware accelerator 1610 may, e.g., have one or more levels of a neural network (or portion(s) thereof) designed into its hardware. Thus, after configuration of the CIM accelerator 1610, input values are applied to the configured CIM's neural network for processing. A resultant is ultimately presented and written back to register space and/or system memory where the executing thread that invoked the CIM accelerator 1610 is informed of the completion of the CIM accelerator's neural network processing (e.g., by interrupt). If the number of neural network levels and/or neurons per level that are physically implemented in the CIM hardware accelerator 1610 is less than the number of levels/neurons of the neural network to be processed, the processing through the neural network may be accomplished by repeatedly loading the CIM hardware 1610 with next configuration information and iteratively processing through the CIM hardware 1610 until all levels of the neural network have been processed.

In various embodiments, the CPU cores 1610, main memory controller 1602, peripheral control hub 1603 and last level cache 1604 are integrated on a processor semiconductor chip. The CIM hardware accelerator 1610 may be integrated on the same processor semiconductor chip or may be an off-chip accelerator. In the case of the later, the CIM hardware 1610 may still be integrated within a same semiconductor chip package as the processor or disposed on a same interposer with the processor for mounting to, e.g., a larger system motherboard. Further still the accelerator 1610 may be coupled to the processor over some kind of external connection interface (e.g., PCIe, a packet network (e.g., Ethernet), etc.). In various embodiments where the CIM accelerator 1610 is integrated on the processor it may be tightly coupled with or integrated within the last level cache 1604 so that, e.g., it can use at least some of the cache memory resources of the last level cache 1604.

FIG. 16b shows another embodiment in which a CIM execution unit 1620 (also referred to as functional unit) is added to the execution units (or functional units) of the instruction execution pipeline(s) 1630 of a general purpose CPU processing core. FIG. 16b depicts a single CPU core having multiple instruction execution pipelines 1630 where each instruction execution pipeline is enhanced to include a CIM execution unit 1620 for supporting neural network/ artificial intelligence processing (for simplicity the traditional execution units used to support the traditional ISA are not shown). Here, the ISA of each instruction execution pipeline may be enhanced to support an instruction that invokes the CIM execution unit. The execution of the CIM instruction may be similar to the invocation of the CIM accelerator described just above with respect to FIG. 16b although on a smaller scale.

That is, for instance, the CIM execution unit may include hardware for only a portion of a neural network (e.g., only one or a few neural network levels and/or fewer neurons and/or weighted connection paths actually implemented in hardware). Nevertheless, the processing of multiple neurons and/or multiple weighted connections may be performed in a single instruction by a single execution unit. As such the CIM execution unit and/or the instruction that invokes it may be comparable to a vector or single instruction multiple data (SIMD) execution unit and/or instruction. Further still, if the single instruction and execution unit is able to implement different math functions along different lanes (e.g., simultaneous of execution of multiple neurons having different math functions), the instruction may even be more comparable to that of a multiple instruction (or multiple opcode) multiple data (MIMD) machine.

Connection weight and/or math function definition may be specified as input operand data of the instruction and reside in the register space associated with the pipeline that is executing the instruction. As such, the instruction format of the instruction may define not only multiple data values but possibly also, as alluded to above, not just one opcode but multiple opcodes. The resultant of the instruction may be written back to register space, e.g., in vector form.

Processing over a complete neural network may be accomplished by concurrently and/or sequentially executing a number of CIM execution unit instructions that each process over a different region of the neural network. In the case of sequential execution, a following CIM instruction may operate on the output resultant(s) of a preceding CIM instruction. In the case of simultaneous or at least some degree of concurrent execution, different regions of a same neural network may be concurrently processed in a same time period by different CIM execution units. For example, the neural network may be effected as a multi-threaded application that spreads the neural network processing over multiple instruction execution pipelines to concurrently invoke the CIM hardware of the different pipelines to process over different regions of the neural network. Concurrent processing per pipeline may also be achieved by incorporating more than one CIM execution unit per pipeline.

Note that although the discussion of FIGS. 1 and 2 suggested that processing a neural network in a traditional CPU environment may be inefficient, introduction of a CIM execution unit as discussed above into one or more CPU cores may greatly alleviate such inefficiency because the CIM execution units are able to consume the information of a neural network at much greater efficiency than a traditional CPU could executing only traditional CPU instructions (e.g., less transfer of information between the CPU core(s) and system memory is effected).

Note that in various embodiments the CIM accelerator of FIG. 16a may be partially or wholly implemented as one or more instruction execution pipelines having one or more CIM execution units capable of executing a CIM instruction as described above with respect to FIG. 16b.

FIG. 17 provides an exemplary depiction of a computing system 1700 (e.g., a smartphone, a tablet computer, a laptop computer, a desktop computer, a server computer, etc.). As observed in FIG. 17, the basic computing system 1700 may include a central processing unit 1701 (which may include, e.g., a plurality of general purpose processing cores 1715_1 through 1715_X) and a main memory controller 1717 disposed on a multi-core processor or applications processor, system memory 1702, a display 1703 (e.g., touchscreen, flat-panel), a local interconnected point-to-point link (e.g., USB) interface 1704, various network I/O functions 1705 (such as an Ethernet interface and/or cellular modem subsystem), a wireless local area network (e.g., WiFi) interface 1706, a wireless point-to-point link (e.g., Bluetooth) interface 1707 and a Global Positioning System interface 1708, various sensors 1709_1 through 1709_Y, one or more cameras 1710, a battery 1711, a power management control unit 1712, a speaker and microphone 1713 and an audio coder/decoder 1714.

An applications processor or multi-core processor 1750 may include one or more general purpose processing cores 1715 within its CPU 1701, one or more graphical processing units 1716, a memory management function 1717 (e.g., a memory controller) and an I/O control function 1718. The general purpose processing cores 1715 typically execute the operating system and application software of the computing system. The graphics processing unit 1716 typically executes graphics intensive functions to, e.g., generate graphics information that is presented on the display 1703. The memory control function 1717 interfaces with the system memory 1702 to write/read data to/from system memory 1702. The power management control unit 1712 generally controls the power consumption of the system 1700.

Each of the touchscreen display 1703, the communication interfaces 1704-1707, the GPS interface 1708, the sensors 1709, the camera(s) 1710, and the speaker/microphone codec 1713, 1714 all can be viewed as various forms of I/O (input and/or output) relative to the overall computing system including, where appropriate, an integrated peripheral device as well (e.g., the one or more cameras 1710). Depending on implementation, various ones of these I/O components may be integrated on the applications processor/multi-core processor 1750 or may be located off the die or outside the package of the applications processor/multi-core processor 1750. The computing system also includes non-volatile mass storage 1720 which may be the mass storage component of the system which may be composed of one or more non volatile mass storage devices (e.g. hard disk drive, solid state drive, etc.).

The computing system may contain a CIM circuit that provides for more than two voltage levels on a read data wire in which distributions of the different voltages on the read wire do not overlap as described in detail by the teachings above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hard interconnected logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a compute-in-memory (CIM) circuit for implementing a neural network disposed on a semiconductor chip, the CIM circuit comprising a mathematical computation circuit coupled to a memory array, the mathematical computation circuit comprising a switched capacitor circuit, the switched capacitor circuit comprising a back-end-of-line (BEOL) capacitor coupled to a thin film transistor within the metal/dielectric layers of the semiconductor chip.

2. The apparatus of claim 1 wherein the memory array comprises a static random access memory (SRAM) memory array.

3. The apparatus of claim 2 wherein the BEOL capacitor and thin film transistor are located above the SRAM memory array.

4. The apparatus of claim 3 wherein the mathematical computation circuit is to accumulate values read from the memory array.

5. The apparatus of claim 3 wherein the mathematical computation circuit is to multiply and accumulate values read from the memory array.

6. The apparatus of claim 1 wherein the mathematical computation circuit is to accumulate values read from the memory array.

7. The apparatus of claim 1 wherein the mathematical computation circuit is to multiply and accumulate values read from the memory array.

8. An apparatus, comprising:
a compute-in-memory (CIM) circuit for implementing a neural network disposed on a semiconductor chip, the CIM circuit comprising a mathematical computation circuit coupled to a memory array, the mathematical computation circuit comprising an accumulation circuit, the accumulation circuit comprising a ferroelectric BEOL capacitor to store a value to be accumulated with other values stored by other ferroelectric BEOL capacitors.

9. The apparatus of claim 8 wherein the memory array comprises a static random access memory (SRAM) memory array.

10. The apparatus of claim 9 wherein the ferroelectric BEOL capacitor is located above the SRAM memory array.

11. The apparatus of claim 10 wherein the mathematical computation circuit is to accumulate values read from the memory array.

12. The apparatus of claim 10 wherein the mathematical computation circuit is to multiply and accumulate values read from the memory array.

13. The apparatus of claim 8 wherein the mathematical computation circuit is to accumulate values read from the memory array.

14. The apparatus of claim 8 wherein the mathematical computation circuit is to multiply and accumulate values read from the memory array.

15. The apparatus of claim 8 wherein ferroelectric material of the ferroelectric BEOL capacitor comprises grain sizes less than 3 nm and/or is amorphous.

16. The apparatus of claim 8 wherein the ferroelectric BEOL capacitor comprises material selected from the group consisting of:
hafnium zirconium oxide;
hafnium oxide;
zirconium oxide;
hafnium aluminum oxide;
hafnium silicon oxide;
hafnium zirconium aluminum oxide;
hafnium zirconium silicon oxide;
hafnium yttrium oxide;
yttrium zirconium oxide;
hafnium yttrium zirconium oxide.

17. The apparatus of claim 16 wherein the material is doped with yttrium.

18. The apparatus of claim 8 wherein the CIM circuit further comprises a switched capacitor circuit that comprises a circuit to sense a switch in dipole moment direction of the ferroelectric capacitor, wherein, the sense of the switch is to determine an accumulate value.

19. The apparatus of claim 18 wherein the circuit is a current sensing circuit.

* * * * *